(12) United States Patent
Naito et al.

(10) Patent No.: US 9,666,239 B2
(45) Date of Patent: May 30, 2017

(54) SEMICONDUCTOR DEVICE

(71) Applicant: KABUSHIKI KAISHA TOSHIBA, Tokyo (JP)

(72) Inventors: Hiroaki Naito, Yokkaichi Mie (JP); Tatsuya Fukumura, Yokkaichi Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 72 days.

(21) Appl. No.: 14/636,017

(22) Filed: Mar. 2, 2015

(65) Prior Publication Data
US 2016/0035396 A1 Feb. 4, 2016

Related U.S. Application Data

(60) Provisional application No. 62/033,054, filed on Aug. 4, 2014.

(51) Int. Cl.
| | | |
|---|---|---|
| *H01L 23/48* | (2006.01) | |
| *G11C 5/06* | (2006.01) | |
| *H01L 23/528* | (2006.01) | |
| *G11C 16/04* | (2006.01) | |
| *H01L 23/522* | (2006.01) | |
| *H01L 27/02* | (2006.01) | |

(52) U.S. Cl.
CPC .......... *G11C 5/063* (2013.01); *G11C 16/0483* (2013.01); *H01L 23/522* (2013.01); *H01L 23/528* (2013.01); *H01L 27/0207* (2013.01); *H01L 2924/0002* (2013.01)

(58) Field of Classification Search
CPC . H01L 27/0207; H01L 23/528; H01L 23/522; G11C 16/0483; G11C 5/06
USPC .................................................. 257/692, 773
See application file for complete search history.

(56) References Cited

U.S. PATENT DOCUMENTS

| | | | |
|---|---|---|---|
| 2012/0020158 A1 | 1/2012 | Ozaki et al. | |
| 2012/0241834 A1* | 9/2012 | Nakajima | H01L 21/0337 257/316 |
| 2013/0082388 A1* | 4/2013 | Matsuda | H01L 27/11519 257/773 |

FOREIGN PATENT DOCUMENTS

JP        2011119536 A     6/2011

* cited by examiner

*Primary Examiner* — Kimberly Rizkallah
*Assistant Examiner* — Maria Ligai
(74) *Attorney, Agent, or Firm* — Patterson & Sheridan, LLP

(57) ABSTRACT

According to an embodiment, a semiconductor device includes a plurality of wiring patterns of wiring lines disposed in parallel in a line-and-space pattern in a predetermined pitch and extend in a first direction in a first region, first bending patterns that extend pairs of the wiring lines in a second in a second region adjacent to the first region, second bending patterns extend the pairs of wiring lines in opposite directions along the orientation of the first direction in the second region, and dummy patterns separated from the two second bending patterns at a predetermined distance.

20 Claims, 43 Drawing Sheets

SEMICONDUCTOR DEVICE

CROSS-REFERENCE TO RELATED APPLICATION

This application is based upon and claims the benefit of priority from U.S. Provisional Patent Application No. 62/033,054, filed Aug. 4, 2014, the entire contents of which are incorporated herein by reference.

FIELD

Embodiments described herein relate to a semiconductor device.

BACKGROUND

In a semiconductor device, semiconductor elements thereof have been miniaturized, as the capabilities of processing techniques have progressed. However, further miniaturization of the semiconductor elements has recently reached the limits of pattern width miniaturization, based on the physical (optical) limit of optical exposure used in photolithography. However, multi-patterning methods, such as double patterning, which are capable of obtaining a line-and-space (L/S) pattern having a pattern and spacing width below the optical limits of lithographic exposure resolution, has attracted much attention.

One such double patterning technique is a sidewall transfer technique, wherein a sacrificial material is pattern etched, a masking material is deposited into the removed portions of the sacrificial material and is further etched in the region between remaining sacrificial material locations to leave a thin masking layer only on the sidewalls of the sacrificial material, and then the sacrificial material is removed, leaving the very thin masking layer behind to serve as a process mask for further processing. However, where the line-and-space pattern to be formed using this technique has curving or "bending" regions, the resultant line structures in the bending region become thicker than in other portions of the pattern, such as where the pattern includes generally parallel straight lines. As a result, wiring patterns formed using this technology may come into contact with each other in locations where the pattern bends, and thus short-circuit to one another. For this reason, the disposition of a dummy pattern for suppressing the occurrence of such an error is considered. That is, a plurality of wiring patterns are bent and expanded and a dummy pattern is disposed at a portion where a single wiring pattern is disposed so that a state where a single wiring pattern is disposed is not provided, thereby suppressing an error occurring due to processing conversion.

On the other hand, as a configuration for achieving an insulation state between wiring patterns, an air gap structure using air or a vacuum state as an insulator is adopted. This is a technique of forming an insulating film so as to connect and cover upper portions of wiring patterns without filling spaces between the wiring patterns to thereby form an "air" gap or vacuum gap, where the overlying capping dielectric layer is deposited in vacuum, gap between the wiring patterns.

Therefore, in the technique of forming the air gap between the wiring patterns as described above, the air gap is formed in a portion in which the dummy pattern is provided. For this reason, when processing of the wiring patterns is performed, the air gap may be opened when removing the dummy pattern. When a portion in which the air gap is opened is generated, there is a problem in that the etch chemical(s) enter the air gap from the opened portion in a subsequent process.

DETAILED DESCRIPTION

In general, according to one embodiment, a semiconductor device includes wiring patterns including wiring lines disposed in parallel to one another in a line-and-space pattern having a predetermined pitch, and which extend in a first direction (a first axis or direction orientation) in a first region, pairs of wiring lines having a first bending pattern that is curved in a second direction (a second axis or direction orientation) in a second region adjacent to the first region, and formed as an extension of the plurality of wiring pattern lines from the first region, pairs of wiring lines having a second bending pattern that is curved and extended so that the ends of the first bending patterns are separated from each other in the first direction in the second region, and dummy patterns that are separated from the wiring lines in the second bending patterns at a predetermined distance and are generally adjacent to and spaced from the second bending patterns.

First Embodiment

Hereinafter, a NAND type flash memory device according to a first embodiment will be described with reference to FIGS. 1 to 35. In addition, the drawings schematically illustrate portions of a NAND type flash memory, and the relationship between a thickness and a planar size, a thickness ratio of each layer, and the like as shown in the Figures does not necessarily coincide with those of an actual device. In addition, horizontal and vertical directions indicate relative directions when a circuit formation surface side of a semiconductor substrate to be described herein faces upwards, and the directions do not necessarily coincide with directions based on a gravitational acceleration direction.

Figure 1:
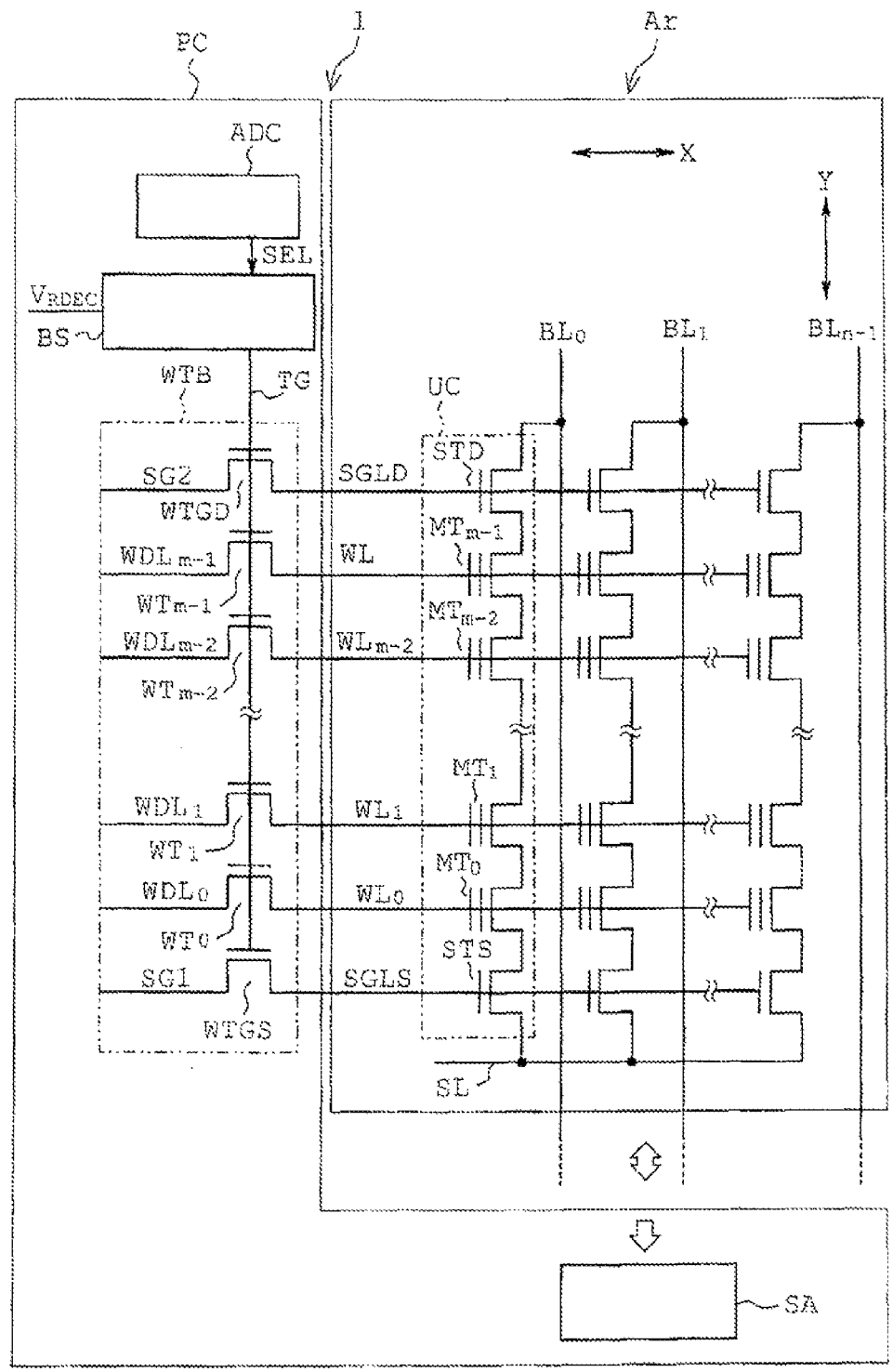
FIG. 1 is circuit diagram showing an example of an equivalent circuit illustrating a schematic electrical configuration of a memory cell region according to a first embodiment.

FIG. 1 is a schematic wiring diagram illustrating an electrical configuration of a NAND type flash memory device. As illustrated in FIG. 1, a NAND type flash memory device 1 includes a memory cell array Ar in which a large number of memory cells are disposed, i.e., laid out, in matrix form, and a peripheral circuit PC that reads from, writes to, and erases the memory cells of the memory cell array Ar, an input and output interface circuit not illustrated in the drawing, and the like.

A plurality of cell units UC are disposed in the memory cell array Ar. The cell units UC include a selection gate transistor STD connected to each bit lines $BL_0 \ldots BL_{n-1}$ side of a plurality of memory cell transistors MT, a selection gate transistor STS connected to a source line SL side of a plurality of memory cell transistors MT, and for example, thirty-two memory cell transistors $MT_0 \ldots MT_{m-1}$ disposed between the selection gate transistors STD and STS and connected to each other in series.

In one memory block, n columns of cell units UC extend in a Y (second) direction and are spaced apart from one another in an X direction (row direction; horizontal direction in FIG. 1) which is a first direction. In the memory cell array Ar, a plurality of blocks is located in the Y direction. In addition, FIG. 1 illustrates one block for the purpose of simplifying a description of the device.

A peripheral circuit region, including a peripheral circuit PC, is provided at the periphery of a memory cell region of the memory cell array Ar. The peripheral circuit PC includes an address decoder ADC, a sense amplifier SA, a booster circuit (booster circuit) BS including a charge pump circuit, a transfer transistor WTB, and the like. The address decoder ADC is electrically connected to the transfer transistor WTB through the booster circuit BS. The peripheral circuit PC includes a resistive element R (not shown) as a peripheral circuit element.

The address decoder ADC selects one block B in response to an address signal applied from the outside. The booster circuit BS is supplied with a driving voltage $V_{RDEC}$ from the outside of the address decoder ADC. When a selection signal SEL of the block B is applied thereto, the booster circuit boosts the driving voltage $V_{RDEC}$ to thereby supply a predetermined voltage to the transfer gate transistors WTGD, WTGS, and $WT_0$ to $WT_{n-1}$ through a transfer gate line TG.

The transfer transistor unit WTB includes the transfer gate transistor WTGD provided corresponding to the selection gate transistor STD, a transfer gate transistor WTGS provided corresponding to the selection gate transistor STS, and a plurality of word line transfer gate transistors $WT_0$ to $WT_{m-1}$ provided to corresponding to the respective memory cell transistors $MT_0$ to $MT_{m-1}$, and the like, and interconnected, through their gates, electrically in common with the transfer gate transistors WTDG and WTGS at either end of the string of memory cell transistors $MT_0$ to $MT_{m-1}$. A transfer transistor unit WTB is provided in each block B.

Figure 2:
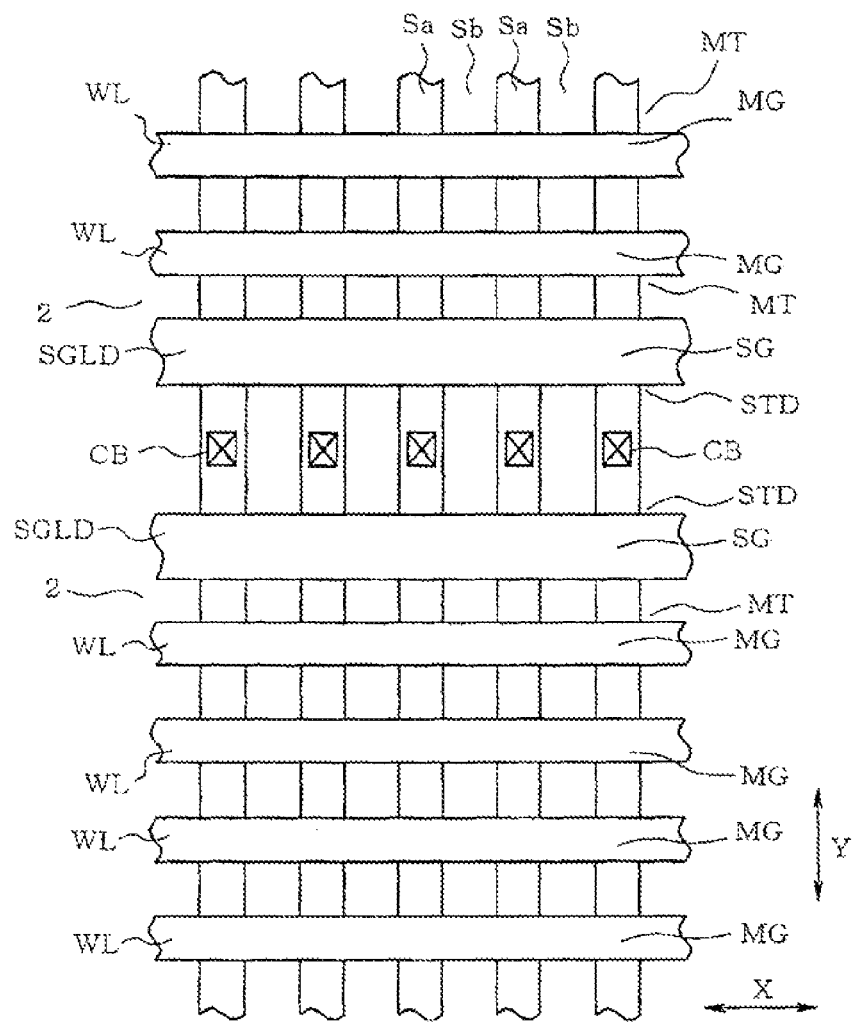
FIG. 2 is an example of a plan view illustrating a layout of the memory cell region when seen from the upper surfaces of an interlayer insulating film and a contact plug.

One of a drain and a source of the transfer gate transistor WTGD is connected to a selection gate driver line SG2, and the other of the drain and the source is connected to a selection gate line SGLD and thus is connected to each of the gates SG of the selection gate transistors STD in the cell units spaced apart in the X direction in the adjacent block. One of a drain and a source of the transfer gate transistor WTGS is connected to a selection gate driver line SG1, and the other of the drain and the source is connected to a selection gate line SGLD and thus is connected to each of the gates SG of the selection gate transistors STs in the cell units spaced apart in the X direction in the adjacent block. One of a drain and a source of each of the transfer gate transistors $WT_0$ to $WT_{m-1}$ extending between the transfer gate transistors WTGD and WTGS is connected to a different word line driving signal line $WDL_0$ to $WDL_{m-1}$, and the other of the source and the drain is connected to a different one of the word lines $WL_0$ to $WL_{m-1}$ provided within the memory cell array Ar (memory cell region M), and is thus connected to the gate of each memory transistor along that word line WL in each cell unit UC spaced apart in the X direction of the adjacent block. In the description of FIG. 2 and the subsequent drawings, the selection gate transistors STD and STS will be referred to as a selection gate transistor Trs, and the memory cell transistors $MT_0$ to $MT_{m-1}$ will be referred to as a memory cell transistor Trm.

The gate electrodes of the transfer gate transistors WTGD, WTGS, and $WT_0$ to $WT_{m-1}$, are connected to each other in common by the transfer gate line TG and are thus also connected to a boosting voltage supply terminal of the booster circuit BS. The sense amplifier SA is connected to the bit lines $BL_0$ to $BL_{n-1}$, and is also connected to a latch circuit that temporarily stores data at the time of reading out the data. Meanwhile, in the description of FIG. 2 and the subsequent drawings, a transistor formed in the peripheral circuit region will be referred to as TrP.

FIG. 2 is an example of a schematic plan view illustrating a physical layout pattern of a portion of the memory cell region. In FIG. 2, the word lines WL and the selection gate lines SGLD are separated and spaced from one another in the Y direction and are disposed in parallel and extend in the X direction. Although not illustrated in the drawing, the bit lines BL are separated and spaced from one another at predetermined intervals in the X direction and extend in parallel in the Y direction.

An element isolation area Sb is formed which extends in the Y direction in the figure. The element isolation area Sb has shallow trench isolation (STI) structure which is formed by embedding an insulating film within a trench. The plurality of element isolation areas Sb are formed at predetermined intervals (spacings) in the X direction, and extend in the Y direction in FIG. 2 and generally parallel to one another. A plurality of element formation regions Sa extend in the Y direction in the underlying substrate, and are separated from one another other in the X direction by the element isolation areas Sb. That is, the element isolation area Sb is provided between the element formation regions Sa, and the semiconductor substrate is divided into the plurality of element regions Sa by the element isolation areas Sb. Alternatively, the element isolation areas Sb may be formed inwardly of an epitaxial layer grown on the substrate, such that the element formation regions Sa are provided on the epitaxial layer.

The word lines WL extend in a direction (X direction in FIG. 2) perpendicular to the direction of the element formation regions Sa. The plurality of word lines WL extend parallel to one another and are located at predetermined intervals (spacings) in the Y direction of the drawing. A memory cell transistors MT ($MT_0$ to $MT_{m-1}$) is disposed at the location where the word line WL and the element region Sa cross one another. The plurality of memory cell transistors MT adjacent to one another in the Y direction configure a portion of a NAND string (memory cell string).

The selection gate transistors STS and STD are disposed where the selection gate line SGLS and the element region Sa cross and where the selection gate line SGLD and the element region Sa cross, respectively. FIG. 2 illustrates the selection gate lines SGLD and the location of the selection gate transistors STD. Adjacent NAND strings having a selection gate transistor STS at one end of each string and a selection gate transistor STD at the other end of each string, and the selection gate transistors STS of two adjacent strings are located facing one another and the selection gate transistors STD of two adjacent strings are located facing one another. Thus, the selection gate transistors STS and STD are provided adjacent to both outer sides of the memory cell transistors MT in the Y direction.

The plurality of selection gate transistors STD are provided in the X direction in the drawing, and the gate electrodes SG of the respective selection gate transistors STD are electrically connected to each other by the selection gate line SGLD. The selection gate transistor STD is formed in a portion where the selection gate line SGLD and the element region Sa cross each other. A bit line contact BLC is formed on the element region Sa between the adjacent selection gate transistors STD (or STS, not shown).

Although not illustrated in FIG. 2, the plurality of selection gate transistors STS on the source line SL side are provided in the X direction, and gate electrodes of the plurality of selection gate transistors STS are electrically connected to each other by the selection gate line SGLS. The gate electrode SG of the selection gate transistor STS is formed where the selection gate line SGLS and the element region Sa cross one another. A source line contact SLC is provided where the source line SL and the bit line BL cross one another.

In the above-mentioned configuration, the memory cell transistor MT and the selection gate transistors STD and STS are configured to have a plurality of laminated films. A gate insulating film is formed on the semiconductor substrate, and the memory cell transistor MT and the gate electrodes MG and SG of the respective selection gate transistors STD and STS are provided thereon.

In the gate electrode MG of the memory cell transistor MT, a conductive film serving as a floating gate electrode is provided on the gate insulating film, and a conductive film serving as a control gate electrode is provided thereon with an interelectrode insulating film intervened therebetween. The gate electrodes SG of the selection gate transistors STD and STS have the same film configuration as the gate electrode MG of the memory cell transistor MT, except an opening is formed in an interelectrode insulating film and the conductive films corresponding to a floating gate electrode and a control gate electrode are in an electrically connected to one another to have the same potential.

Figure 3:
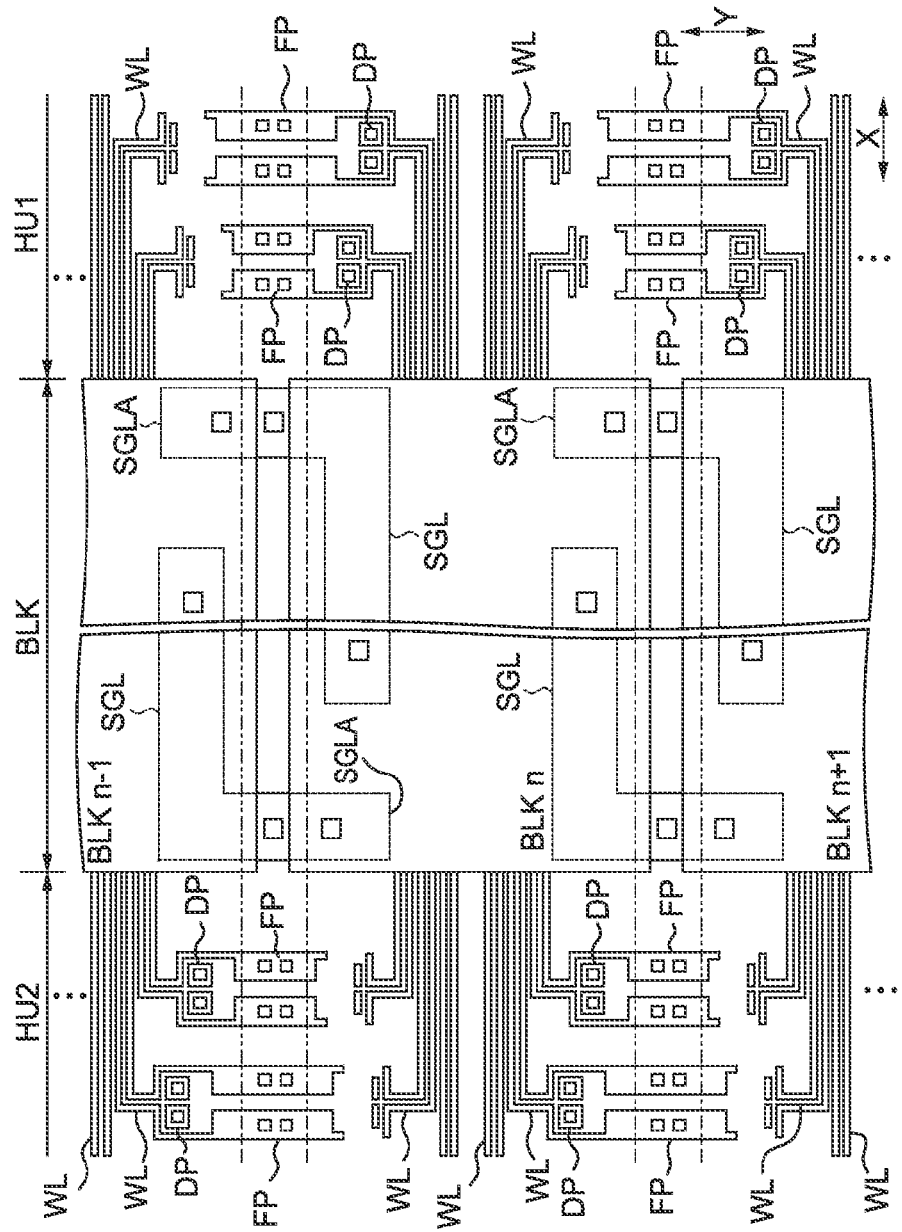
FIG. 3 is an example of a plan view illustrating a layout of a hookup region of word lines in the memory cell region.

In the above-mentioned configuration, the conductive film corresponding to the control gate electrode of the gate electrode MG and the insulating film located on the conductive film extend, as the word line WL, over the plurality of gate electrodes MG adjacent to each other, and are also extend to an extraction region HU (HU1 and HU2 as shown in FIG. 3) disposed in the adjacent peripheral circuit region. Similarly, the conductive film corresponding to the control gate electrode of the gate electrode SG also extend to the extraction region HU as the selection gate lines SGLD and SGLS.

In addition, the gate electrode MG of the memory cell transistor MT is configured such that an air is provided as an insulator between the gate electrodes MG and SG adjacent to one another. An upper portion of the gap between the adjacent gate electrodes MG and a gate electrode MG and adjacent selection gate electrodes is covered by an insulating film, and thus an air gap as a gap insulating portion is provided therein. Therefore, the word lines WL extending to the extraction region HU are also configured such that an air gap is provided between the word lines WL adjacent to each other at the same interval as that of the memory cell region.

Figure 4:
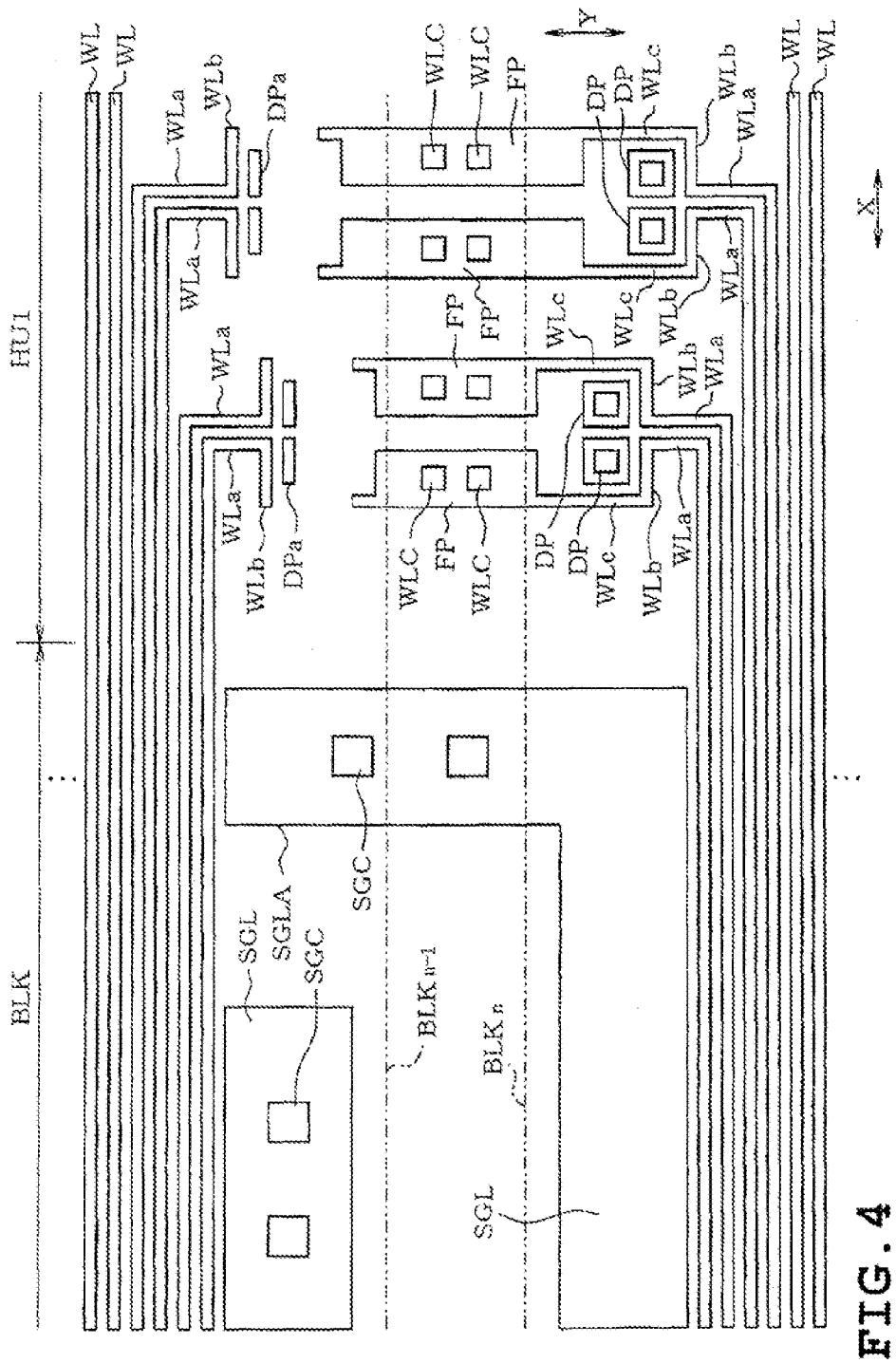
FIG. 4 is an example of a plan view illustrating a specific layout of the hookup region.

Next, the extraction region HU will be described with reference to FIGS. 3 and 4.

FIG. 3 illustrates layout patterns of the wiring pattern layout of each block BLK in a memory cell region MA as a first region and the wiring pattern layout of the extraction regions HU (HU1, HU2) as a second region. For example, in the drawing, a block BLKn is disposed in alignment with blocks BLKn−1 and BLKn+1 which are, in the Figure, horizontally adjacent thereto. In each block BLK (n−1, n, and n+1), memory cell transistors are disposed (laid out) in a matrix or array form, and the word lines WL thereof extend to the right and left to the extraction regions HU1 and HU2. A selection gate line SGL is disposed adjacent to the upper and lower ends of each block BLK.

In the extraction regions HU1 and HU2, the word lines WL extending from the blocks BLKn are bent, i.e., curved, to extend in the Y direction in pairs, i.e., in units of two word lines. For example, in the extraction region HU1, half of the total number of word lines WL disposed within the n-th block BLKn extend into extraction region HU1, and the remaining half of the word lines WL extend into extraction region HU2.

Here, in the right, in the X direction, extraction region HU1 of the block BLKn, the ends of the word lines WL extending from the upper (in the Y direction) portion of block BLKn adjacent to block BLKn−1 into the extraction region HU1 are connected to a fringe pattern FP in the extraction region HU1, and the ends of the other word lines WL extending from the block BLKn into extraction region HU1 are terminated without being connected to the fringe pattern FP. In the left, in the X direction, extraction region HU2 of the block BLKn, the ends of the word lines WL extending thereinto from the upper portion thereof in the Y direction and adjacent to block BLKn−1 are terminated in the extraction region HU2 without being connected to a fringe pattern FP (they terminate in a fringe pattern in extraction region HU1 associate with the block), and the ends of the word lines WL in the lower, in the Y direction, portion of the block BLK1 adjacent to the block BLKn+1 are connected to the fringe pattern FP in extraction region HU2 (they do not terminate in a fringe pattern in extraction region HU1 associate with the block). The fringe patterns FP are provided with a word line contact WLC for connection thereof to the word lines WL.

Adjacent pairs of blocks in the Y direction, for example the two blocks BLKn−1 and BLKn, and the two blocks BLKn and BLKn+1 share a selection gate line SGL. These selection gate lines SGLA include a bending (curved) portion such that a generally straight line first portion is disposed in one block, for example block BLKn, and a second generally straight line portion of the selection line extends generally perpendicular to the first portion and into the adjacent block BLKn−1. Thus each selection gate line includes a generally straight line portion within a first block, and a second generally straight line portion extending generally perpendicularly thereto and into the adjacent block in the Y direction. At the bending (curved) portion SGLA of the selection gate line SGL, the selection gate line SGL of the corresponding portion is cut. In addition, a contact SGC is disposed in each of the selection gate line SGL and the bending portion SGLA.

Next, the configuration of the extraction region HU1 will be described with reference to FIG. 4. FIG. 4 illustrates a planar layout of the extraction region HU1 at the boundary between the block BLKn and block BLKn−1. The selection gate line SGL is disposed at one end, in the Y direction, (upper portion) of the block BLKn, and a tip portion SGLA thereof extends in the X direction from a bend connecting the end portion SGLa and the main portion of selection gate line SGL in block BLKn to form the selection gate line SGL into an L. In addition, as shown in FIG. 3, an additional selection gate line SGL is disposed at an end (lower portion in the Y direction) of the block BLKn−1. An end portion SGLA at the left side of FIG. 3 in the X direction of the additional selection gate line SGL and the end portion SGLA of the selection gate line SGL extending from block BLKn are disposed at a predetermined interval. Each selection gate line SGL is thus provided with two selection gate contacts SGC, one of which is an end portion SGLA.

In the extraction region HU1, the plurality of word lines WL extend therein in the X direction from each of the blocks BLKn and BLKn−1. Half of the plurality of word lines WL of the block BLKn on the block BLKn−1 side are disposed adjacent to half of the word lines WL of the block BLKn−1 on the block BLKn side in the block BLKn. In addition, pairs of word lines WL are bent in the Y direction and thus are first bending portions WLa. The fringe patterns FP are connected to (form the ends of) pairs of word lines in extraction portion HU1 extending from a second bending portion WLb and a third bending portion WLc in the block BLKn. Each fringe pattern is primarily disposed in one of the adjacent blocks, and in FIG. 4 is primarily disposed in block BLKn, and an end portion of the fringe patterns FP extend into the adjacent, in the Y direction, block, in FIG. 4 block BLKn−1. The word lines WL on the block BLKn side are connected to the fringe patterns FP mentioned above, and the word lines WL of the block BLKn−1 are terminated adjacent to the fringe pattern FP. Each fringe pattern FP is connected to two word line contacts WLC.

A first pair of word lines WL of the block BLKn are bent to extend in the Y direction to thereby become the first bend portions WLa, are bent in the X direction to form the second bent portions WLb, then extend a fixed distance, and are bent again to extend in the Y direction to form the third bent portions WLc. In the third bent portions WLc in which the pair of word lines WL again extend in the Y direction, each of the ends thereof is connected to the fringe pattern FP which has a larger width than the word lines WL. A dummy pattern DP is disposed in a portion surrounded by the second bending portion WLb and the third bending portion WLc which correspond to the word line WL on the block BLKn side.

Two dummy patterns DP are formed in a rectangular ring shape having substantially the same line width as the width of the word lines WL. The dummy patterns DP are disposed at a predetermined distance with respect to the second bent portion WLb and the third bent portion WLc of the word line WL, and the two dummy patterns DP are disposed at a distance d from one another and the adjacent bent portions WLb and WLc of the word lines WL. The distance d is equivalent to the spacing distance d between the generally parallel first bent portions WLa of the word line WL. The dummy pattern DP suppresses the occurrence of an error which would otherwise occur when the mask pattern of the line pattern of the second bending portion WLb for lithographic processing of a masking layer is formed.

In addition, the pairs of word lines WL of the block BLKn−1 form the second bent portions WLb which extend in the X direction, and in opposite directions in the Y direction from one another, from the first bent portions WLa extending in the Y direction where they terminate. In addition, a first dummy pattern portion DPa, which is one side of the rectangular shaped line of the dummy pattern DP, is disposed parallel to, and spaced from in the X direction toward block BLKn, second bent portion WLb.

Hereinafter, the above-mentioned configuration is repeatedly provided in the extraction regions HU1 for the pairs of word lines WL, and half of the word lines WL located at the block BLKn adjacent to the block BLKn−1 are connected to the fringe pattern FP through the first bent portion WLa, the second bent portion WLb, and the third bent portion WLc. In addition, as described above, half of the word lines WL located in the block BLKn adjacent to the block BLKn+1 are connected to the fringe pattern FP on the extraction region HU2 side of the block BLKn. As described above, each block BLK is configured such that half of the word lines WL are connected to the fringe pattern FP in the extraction region HU1 and half of the word lines WL are connected to the fringe pattern FP in the extraction region HU2.

In the above-mentioned configuration, the dummy patterns DP disposed in pairs adjacent to the bent portions WLc and WLc of each word line WL are formed such that the dummy patterns do not come into contact with the word lines WL. The distance between the dummy patterns may vary due to variations in pattern processing, or the dummy patterns may be connected state due to variations in pattern processing.

Figure 5:
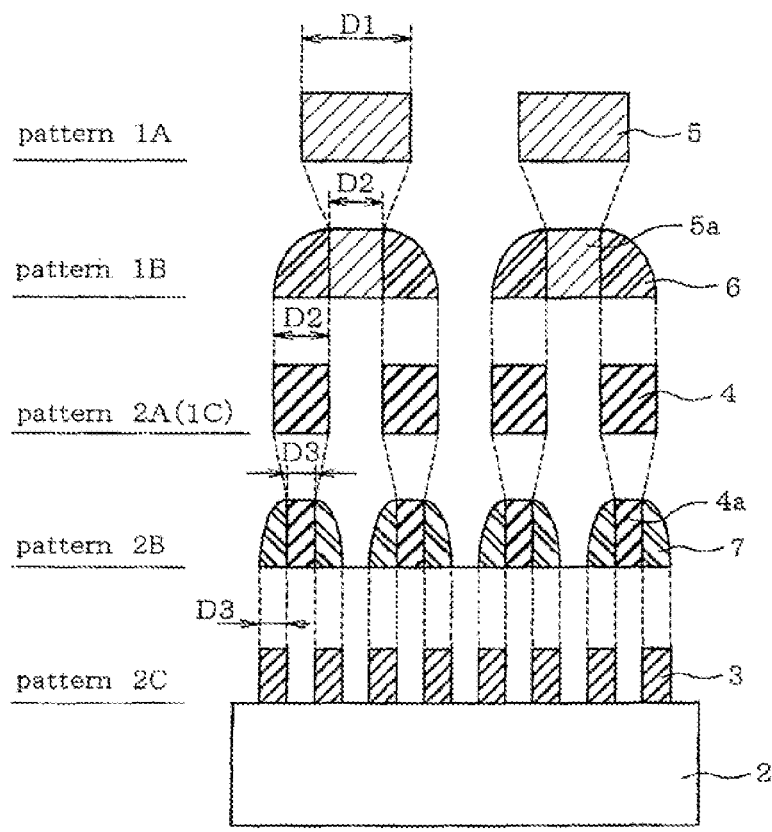
FIG. 5 is an example of a conceptual diagram of processing when a sidewall transfer technique is applied twice.

Next, a processing step in a case where the sidewall transfer technique is used in two different sidewall transfer process steps will be schematically described with reference to FIG. 5. Here, a conductive film 3, which is formed on a ground film 2, as a film to be processed serving as a processing target is assumed. In addition, since the processing step is schematically described, a configuration different from an actual device configuration is illustrated as an example.

That is, three processes for forming a first sidewall are forming a pattern 1A, a pattern 1B, and a pattern 1C, and three processes for forming a second sidewall are forming a pattern 2A, a pattern 2B, and a pattern 2C. In this case, when the sidewall transfer process is performed twice, the pattern 1C is the starting point, or the pattern 2A of the second sidewall transfer process.

In accordance with the above-mentioned process, a second hard mask film 4 used in a second sidewall transfer technique and a first hard mask film 5 used in a first sidewall transfer technique are formed on the conductive film 3, as a stacked film for performing a sidewall transfer technique twice on the conductive film 3. A line-and-space pattern having a pattern width of D3 (=d) and a disposition interval of D3 (=d) is formed by using the sidewall transfer technique twice.

First, in the first sidewall transfer process, a line-and-space pattern having a width of 4d and a disposition interval of D1 (=4d) is formed with respect to the first hard mask film 5, as the first process (pattern 1A). Thus, the core material pattern 5 is formed. This is a width size capable of being obtained through ordinary photolithography techniques using a photoresist as a patterned mask.

Next, in the second process (pattern 1B), the core material pattern 5 formed as described above is processed to have a half width size of D2 (=D1/2=2d) by slimming processing to thereby form a core material pattern 5a. A side wall film having a film thickness of D2 (=D1/2=2d) is formed on the entire surface including the core material pattern 5a, and etch back processing is performed thereon to thereby form a side wall pattern 6 having a width D2, formed in a spacer shape.

Thereafter, in the third process (pattern 1C), the core material pattern 5a is selectively removed by etching so as to leave the side wall pattern 6 having a width D2 (=D1/2=2d) and a disposition interval between sidewall patterns 6 of D2 (=D1/2=2d). Next, as the first process (pattern 2A) in the second sidewall transfer, the sidewall patterns from the pattern 1B form a second core material film 4.

Next, in the second process (pattern 2B), the core material pattern 4 formed as described above is processed to have a half width size of D3 (=D2/2=d) by slimming processing to thereby form a core material pattern 4a. A side wall film having a film thickness D3 (=D2/2=d) is conformally formed on the entire surface including the core material pattern 4a, and etch back processing is performed thereon to thereby form a side wall pattern 7 in a spacer shape having width D3.

Thereafter, in the third process (pattern 2C), the core material pattern 4a is selectively removed by etching so as to leave the side wall pattern 7 having a width size of D3 (=D2/2=d) and a disposition interval of D3 (=D2/2=d). Subsequently, the conductive film 3, which is a film to be processed, is processed using the side wall pattern 7 as a hard mask to thereby form the wiring pattern 3 as a line-and-space pattern having a width size of D3 (=D2/2=d) and a disposition interval (interval spacing) of D3 (=D2/2=d). As described above, it is possible to obtain the wiring pattern 3 as a minute line-and-space pattern having a width size of D3 (=D1/4) which exceeds an exposure limit of a photolithography technique, by using the sidewall transfer technique twice.

In the following description, reference will be made to FIGS. 6 to 35 to describe a process of processing the extraction regions HU1 and HU2 during performing a processing step of a wiring pattern using a sidewall transfer technique twice. Meanwhile, in the following description, diagrams illustrating a planar pattern and partial diagrams illustrating a cross-section at a predetermined cutting position in the planar pattern are used in each process.

Figure 6:
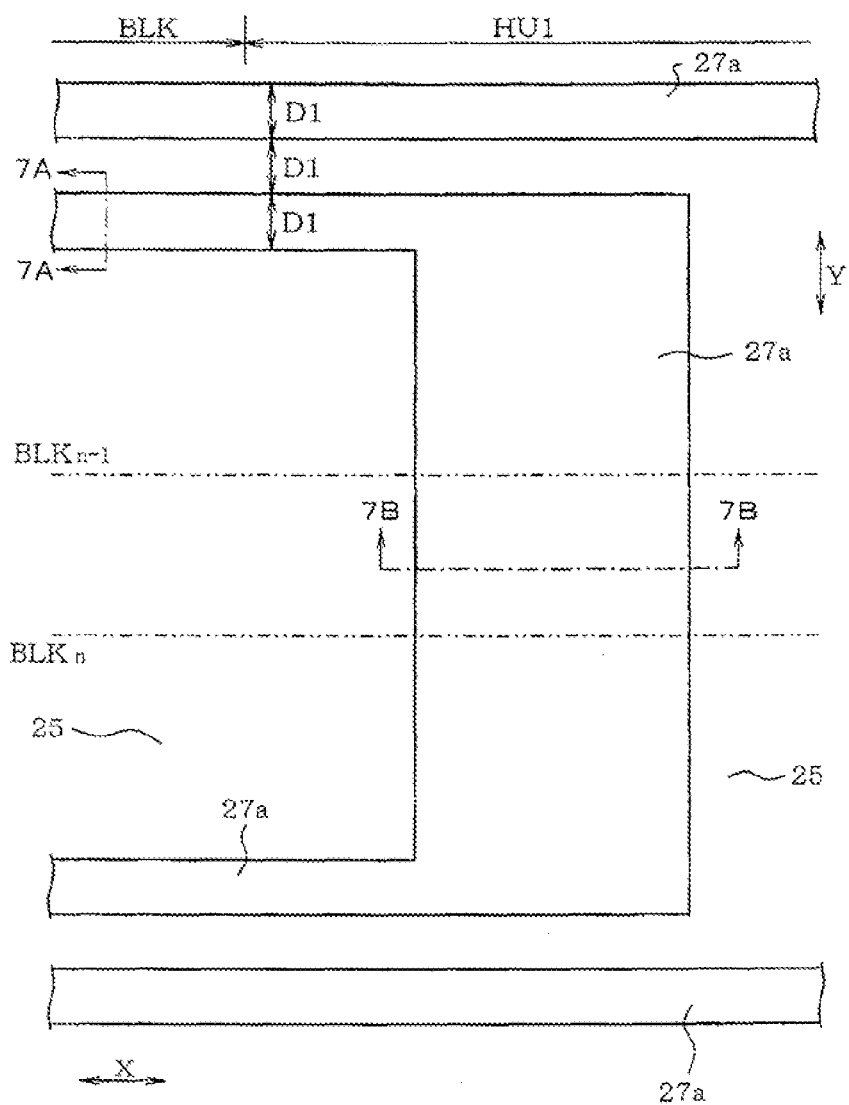
FIG. 6 is an example of a plan view of one step of a manufacturing process illustrating a fringe pattern portion of FIG. 4 (Part 1).
Figure 7A:
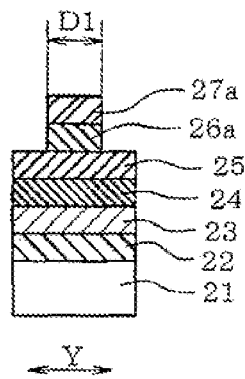
FIG. 7A is an example of a schematic cross-sectional view of a portion taken along line 7A-7A in FIG. 6.
Figure 7B:
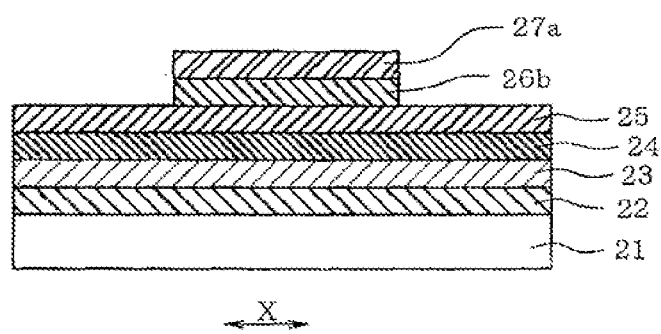
FIG. 7B is an example of a schematic cross-sectional view of a portion taken along line 7B-7B in FIG. 6.

First, as illustrated in FIGS. 6, 7A, and 7B, an insulating film 22 is formed within the regions of the blocks BLKn and BLKn−1 of a semiconductor substrate 21 and on an upper surface of the extraction region HU1 (HU2 is omitted but undergoes the same processing), and a conductive film 23 serving as a film to be processed into the gate electrodes is formed on the insulating film 22. As described above, the conductive film 23 serving as a film to be processed is assumed to have a multi-layered structure including a plurality of films configuring a gate electrode. The conductive film 23 may also be applied as a single film configuration for forming other features of a device. In the film configuration, a second core material film 24 is formed on the conductive film 23, a hard mask film 25 is formed on the second core material film 24, and a first core material film 26 is formed on the hard mask film 25. A resist film 27 is formed on a top surface of the first core material film 26.

Next, the resist film 27 is patterned to thereby form a resist pattern 27a illustrated in FIG. 6, and the first core material film 26 is etched using the resist pattern 27a as a mask. Thus, first core material patterns 26a and 26b are formed. The first core material pattern 26a, which is a portion extending to the extraction region HU1 from the blocks BLKn and BLKn−1, is formed to have a pattern width of D1 (=4d=4D3) equivalent to four times a line width and line spacing of D3 (=d) to be finally formed.

As shown in FIG. 6, at the bottom of the figure two resist patterns 27a, and thus underlying first core material patterns 26a, are located in block BLKn and extend in the X direction. These first core material patterns 26a extend into extraction region HU1, where the first core material pattern 26 closest to block BLKn−1 extends perpendicularly from first core material pattern 26b extending generally in the Y direction to span two adjacent blocks BLKn−1 and BLKn and having a width sufficient form the a fringe pattern Fp therefrom. After the first core material patterns 26a and 26b are formed, the resist film 27 and the resist pattern 27a are removed by asking.

Figure 8:
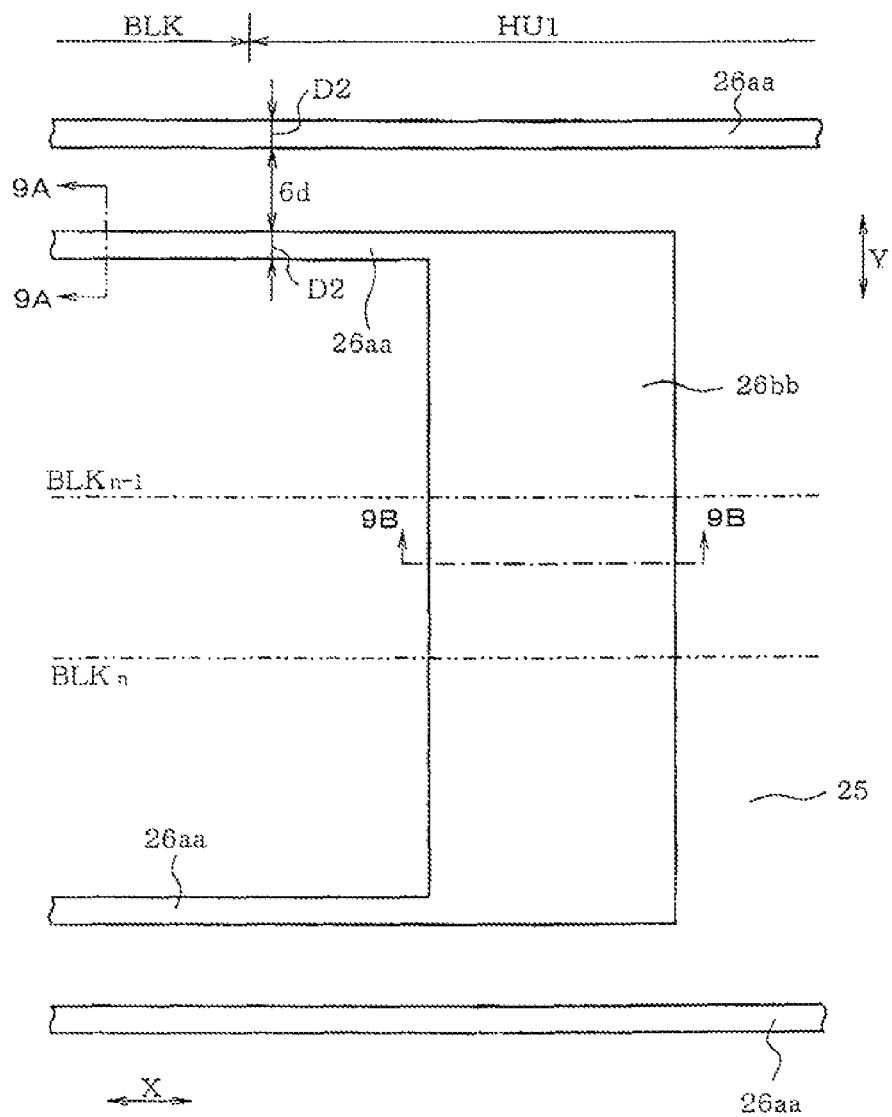
FIG. 8 is an example of a plan view of one step of the manufacturing process illustrating the fringe pattern portion of FIG. 4 (Part 2).
Figure 9A:
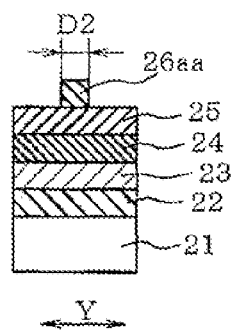
FIG. 9A is an example of a schematic cross-sectional view of a portion taken along line 9A-9A in FIG. 8.
Figure 9B:
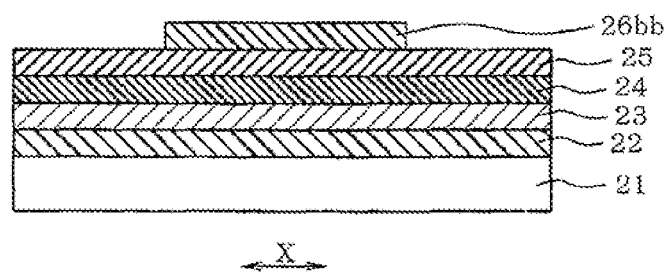
FIG. 9B is an example of a schematic cross-sectional view of a portion taken along line 9B-9B in FIG. 8.

Next, as illustrated in FIGS. 8, 9A, and 9B, each of the first core material patterns 26a and 26b are processed into to first core material patterns 26aa and 26bb, respectively, by slimming. In this case, the first core material patterns 26a extending to the extraction region HU1 from the blocks BLKn and BLKn−1 was formed having a width of D1 (=4d). After slimming both side walls of the first core material pattern, the width is reduced, and thus the first core material pattern 26a is processed into the first core material pattern 26aa having a half width size of D2 (=D1/2=2d). Similarly, the first core material pattern 26b is also slimmed, such that the width thereof is reduced to form the first core material pattern 26bb in which the width thereof is narrowed (reduced) by D2 (=D1/2=2d).

When the first core material patterns 26a and 26b are oxide films such as a silicon oxide film, the slimming may be performed by a wet etching method using hydrogen fluoride (HF) or an isotropic dry etching (chemical dry etching (CDE) or RIE) method. In addition, when the first core material patterns 26a and 26b are films of an organic material, the slimming may be performed by RIE or plasma etching using oxygen ($O_2$) or ozone ($O_3$).

Figure 10:
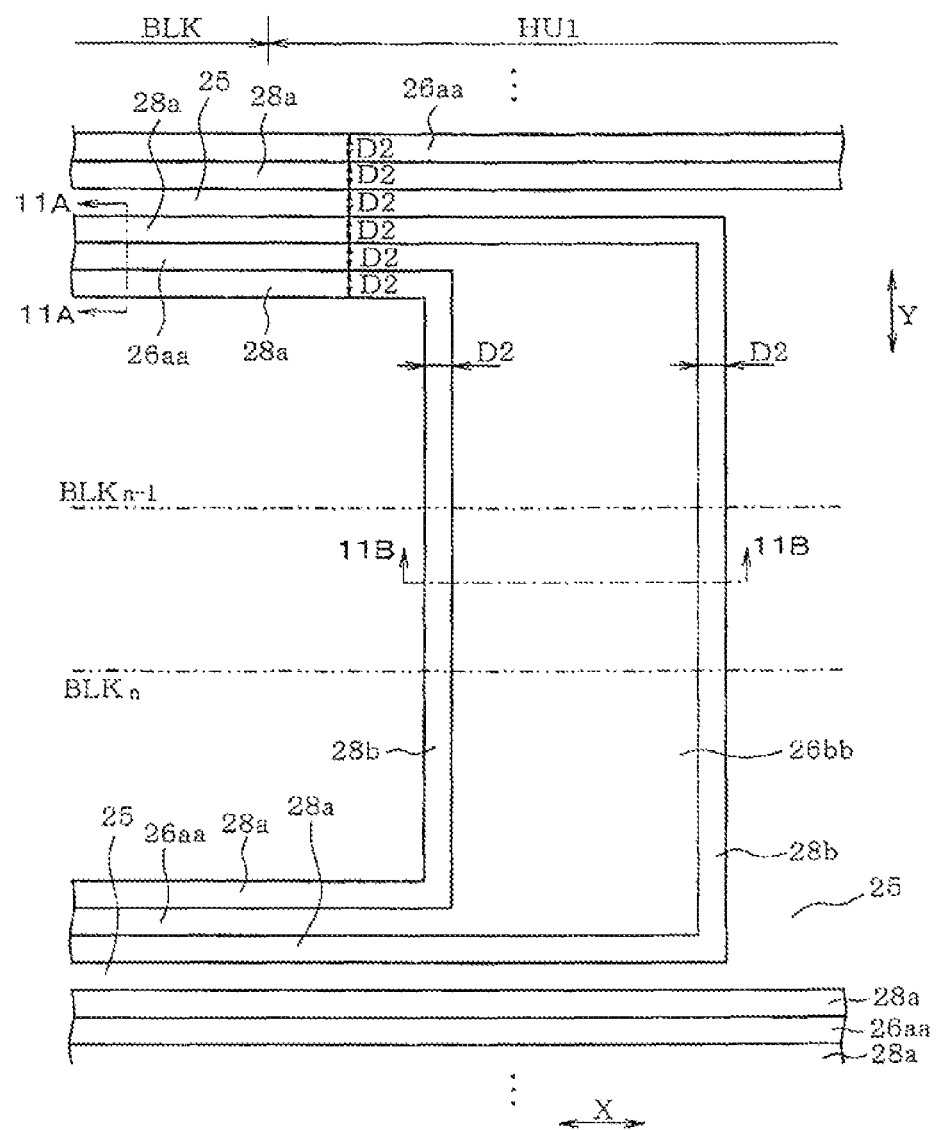
FIG. 10 is an example of a plan view of one step of the manufacturing process illustrating the fringe pattern portion of FIG. 4 (Part 3).
Figure 11A:
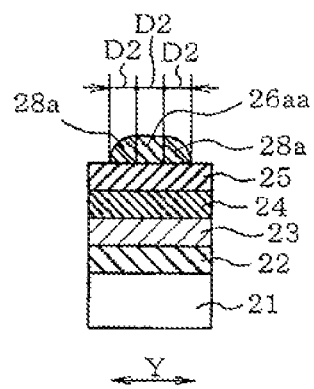
FIG. 11A is an example of a schematic cross-sectional view of a portion taken along line 11A-11A in FIG. 10.
Figure 11B:
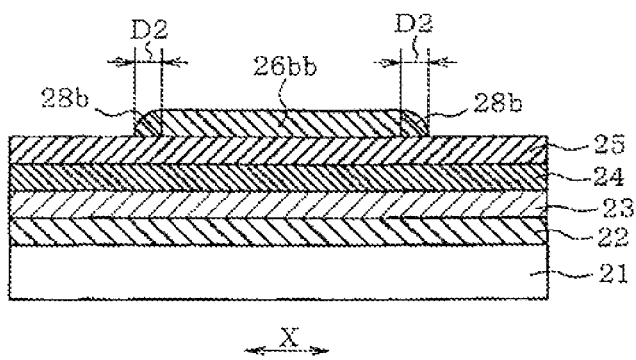
FIG. 11B is an example of a schematic cross-sectional view of a portion taken along line 11B-11B in FIG. 10.

Next, as illustrated in FIGS. 10, 11A, and 11B, first side wall patterns 28a and 28b are formed on side walls of the first core material patterns 26aa and 26bb, respectively. The first side wall patterns 28a and 28b are formed so that the width size thereof is set to D2 (=2d). When the first side wall patterns 28a and 28b are formed, first, a side wall film having a film thickness of D2 (=2d) is conformally formed on the entire surface, and then etching is performed to leave the side wall film on the side wall portions of the first core material patterns 26aa and 26bb by etch back processing. Thus, the first side wall patterns 28a and 28b are formed.

When the first core material patterns 26aa and 26bb are formed of a silicon oxide film, an amorphous silicon film, a polycrystalline silicon film, or the like may be used as the first side wall patterns 28a and 28b. In addition, when an organic film is used as the first core material patterns 26aa and 26bb, a silicon oxide film, a silicon nitride film, or the like which is formed in a low temperature may be used as the first side wall patterns 28a and 28b.

Figure 12:
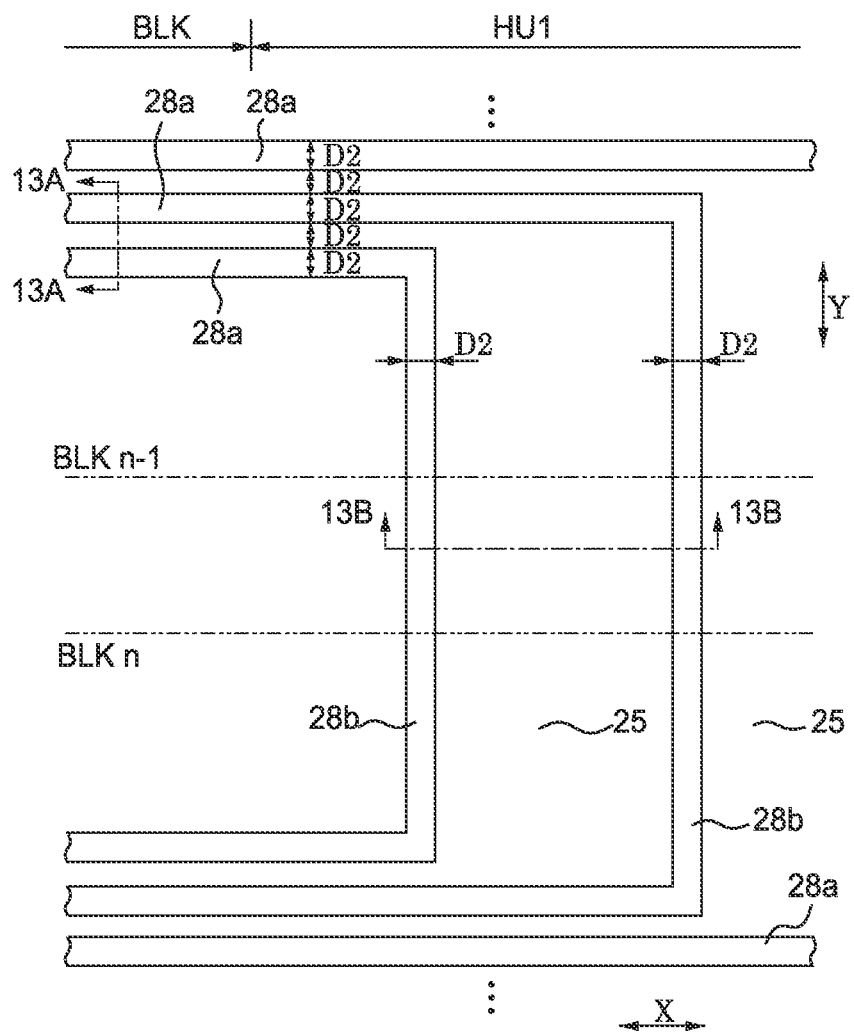
FIG. 12 is an example of a plan view of one step of the manufacturing process illustrating the fringe pattern portion of FIG. 4 (Part 4).
Figure 13A:
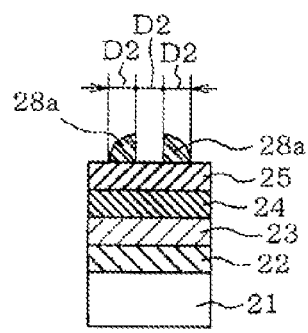
FIG. 13A is an example of a schematic cross-sectional view of a portion taken along line 13A-13A in FIG. 12.
Figure 13B:
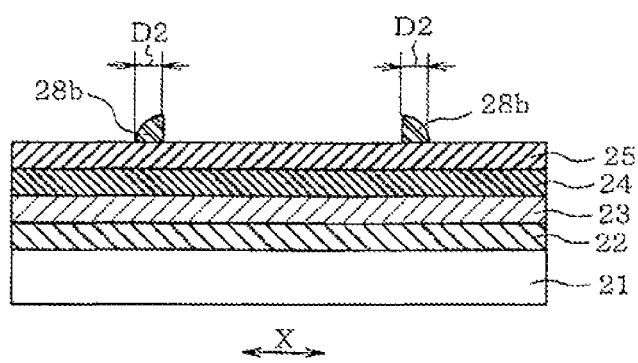
FIG. 13B is an example of a schematic cross-sectional view of a portion taken along line 13B-13B in FIG. 12.

Next, as illustrated in FIGS. 12, 13A, and 13B, the first core material patterns 26aa and 26bb are selectively removed so as to leave the first side wall patterns 28a and 28b on the hard mask film 25. The first core material patterns 26aa and 26bb are removed, and thus the first side wall pattern 28a extending from the block regions BLKn and BLKn−1 to the extraction region HU1 is formed as a line-and-space (L/S) pattern having a width size of 2d and a space width of D2 (=2d). In addition, the first side wall pattern 28b formed in the extraction region HU1 is in a state where the first side wall pattern is connected between the block BLKn and the BLKn−1 so as to have a width size of 2d.

If the first core material patterns 26aa and 26bb are silicon oxide films, wet etching using hydrogen fluoride (HF) or dry etching such as a CDE method or an RIE method may be used to remove the first core material patterns 26aa and 26bb. In addition, when an organic film is used as the first core material patterns 26aa and 26bb, wet etching using a sulfuric acid hydrogen peroxide mixture (SPM), ashing, or the like may be used to remove the first core material patterns 26aa and 26bb.

Figure 14:
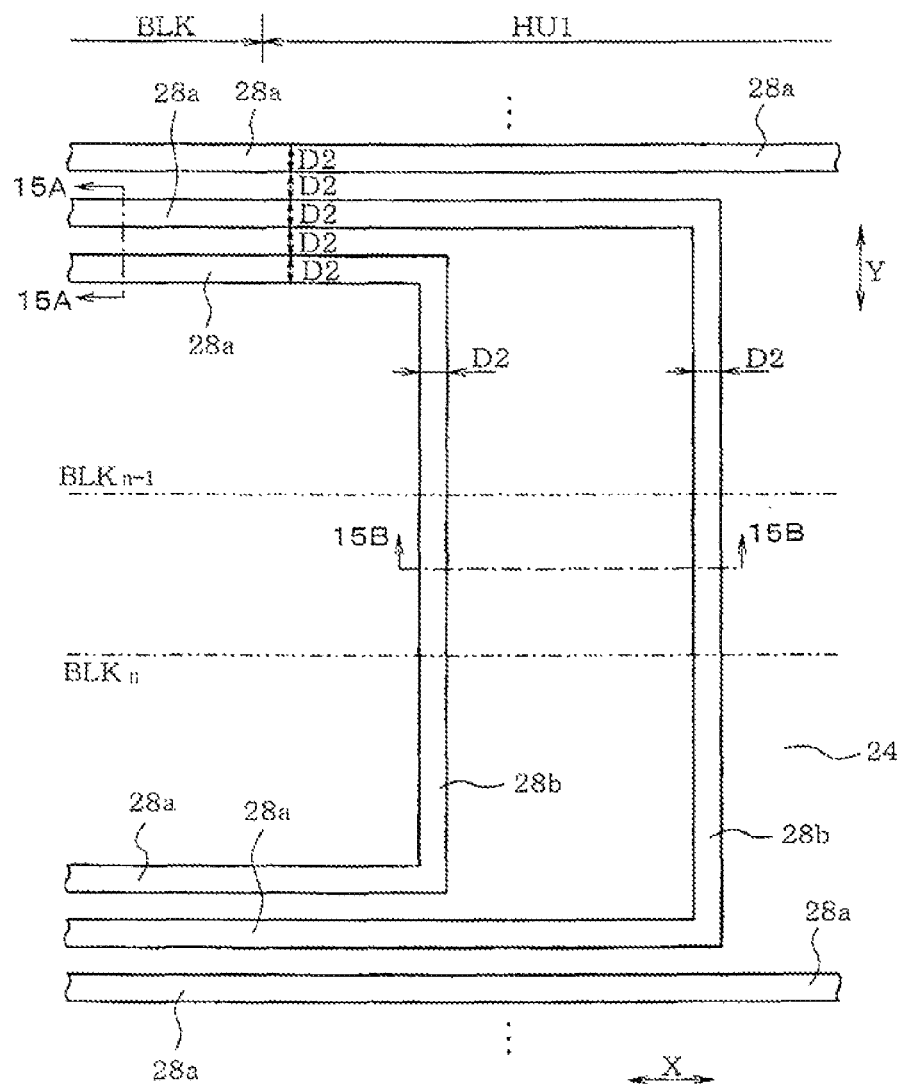
FIG. 14 is an example of a plan view of one step of the manufacturing process illustrating the fringe pattern portion of FIG. 4 (Part 5).
Figure 15A:
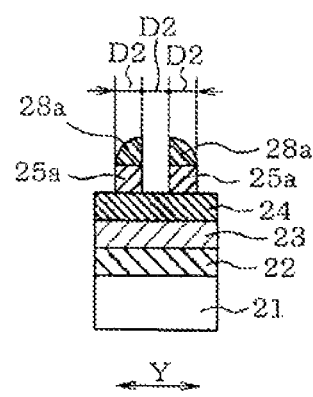
FIG. 15A is an example of a schematic cross-sectional view of a portion taken along line 15A-15A in FIG. 14.
Figure 15B:
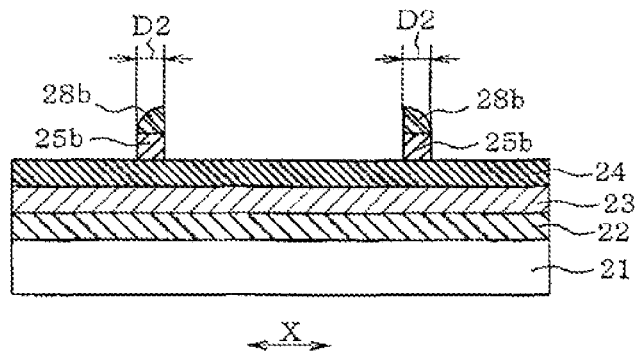
FIG. 15B is an example of a schematic cross-sectional view of a portion taken along line 15B-15B in FIG. 14.
Figure 16:
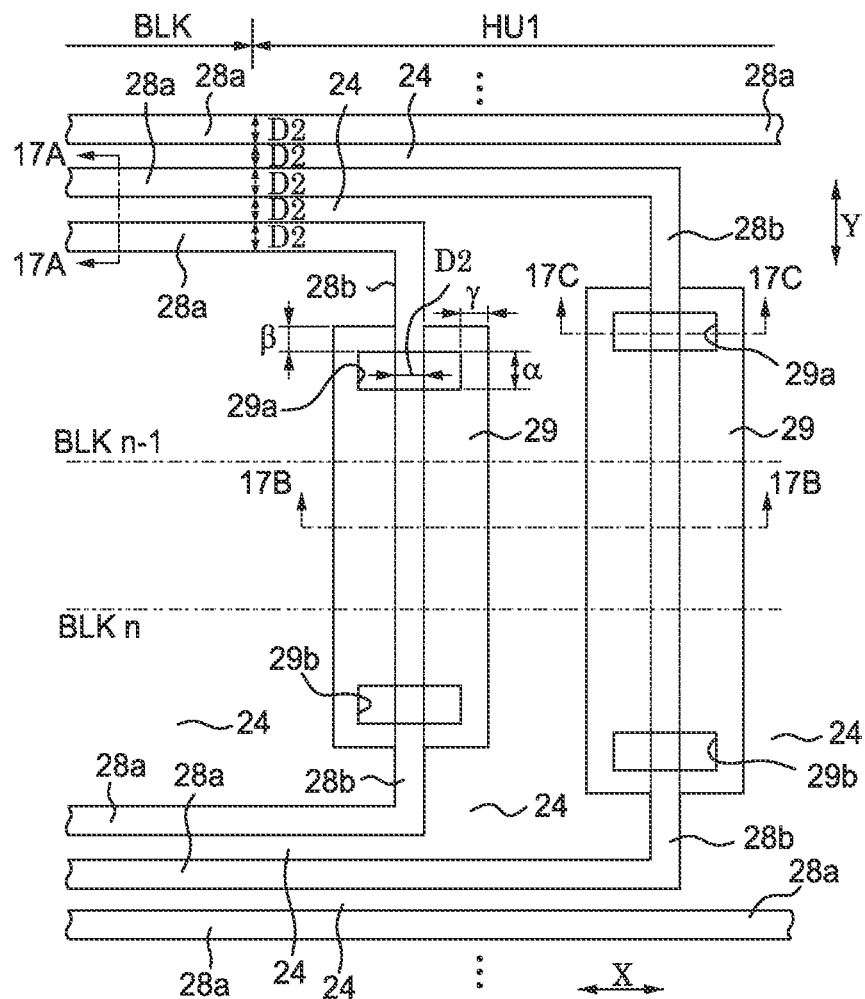
FIG. 16 is an example of a plan view of one step of the manufacturing process illustrating the fringe pattern portion of FIG. 4 (Part 6).
Figure 17A:
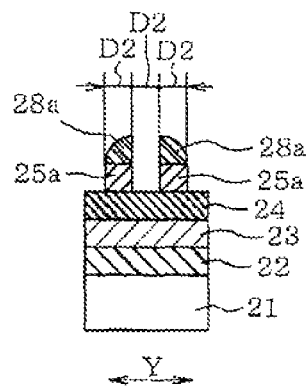
FIG. 17A is an example of a schematic cross-sectional view of a portion taken along line 17A-17A in FIG. 16.
Figure 17B:
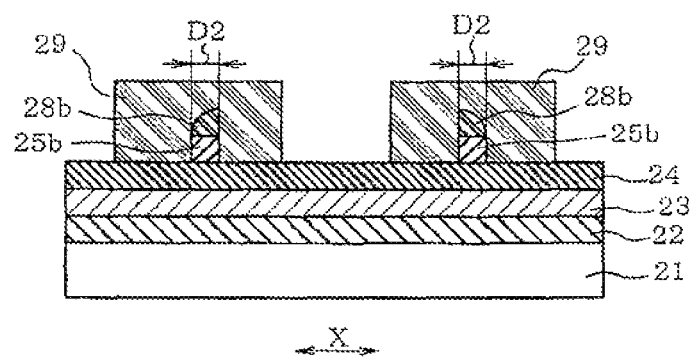
FIG. 17B is an example of a schematic cross-sectional view of a portion taken along line 17B-17B in FIG. 16.
Figure 17C:
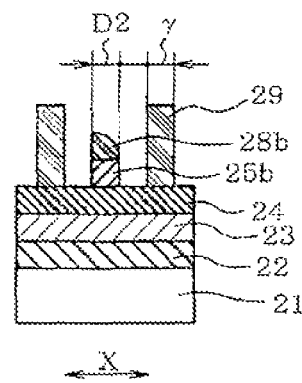
FIG. 17C is an example of a schematic cross-sectional view of a portion taken along line 17C-17C in FIG. 16.
Figure 18:
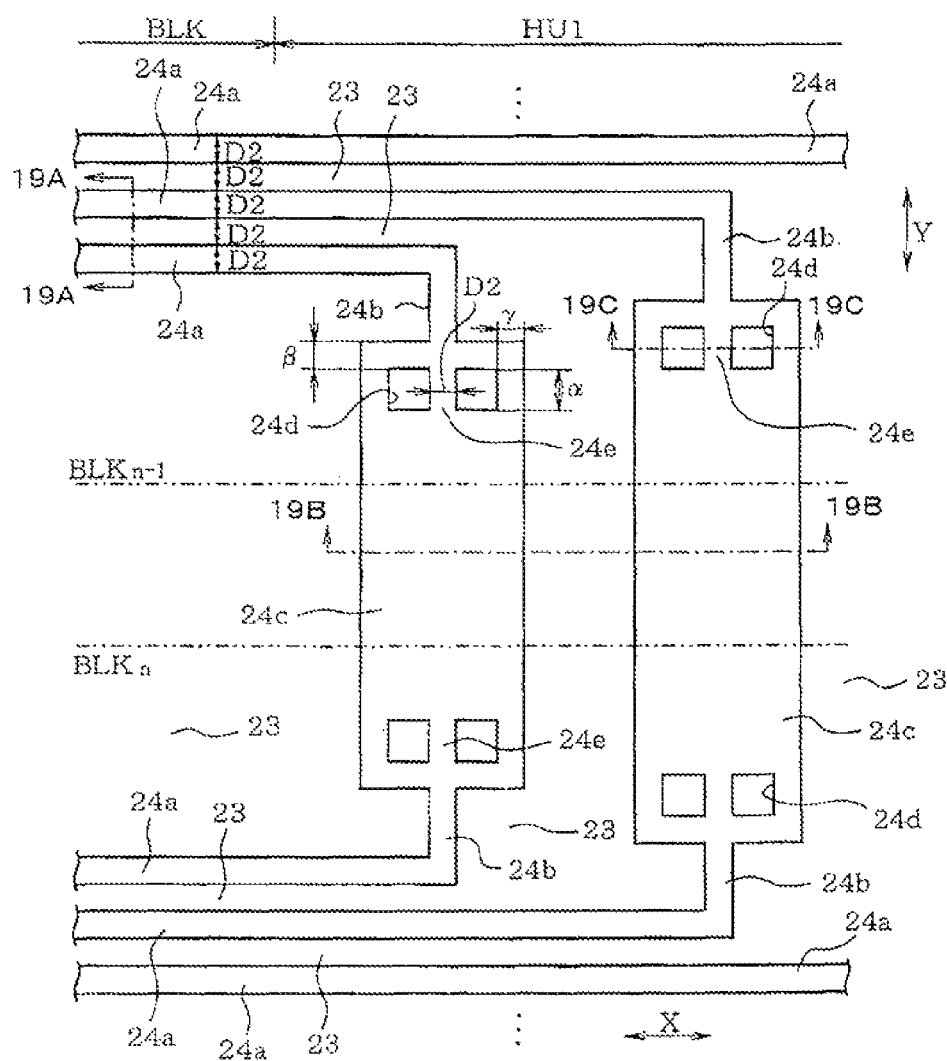
FIG. 18 is an example of a plan view of one step of the manufacturing process illustrating the fringe pattern portion of FIG. 4 (Part 7).
Figure 19A:
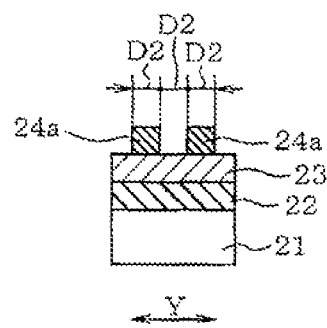
FIG. 19A is an example of a schematic cross-sectional view of a portion taken along line 19A-19A in FIG. 18.
Figure 19B:
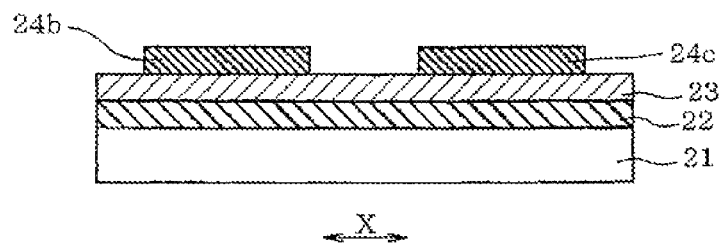
FIG. 19B is an example of a schematic cross-sectional view of a portion taken along line 19B-19B in FIG. 18.
Figure 19C:
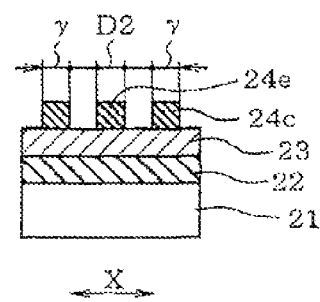
FIG. 19C is an example of a schematic cross-sectional view of a portion taken along line 19C-19C in FIG. 18.
Figure 20:
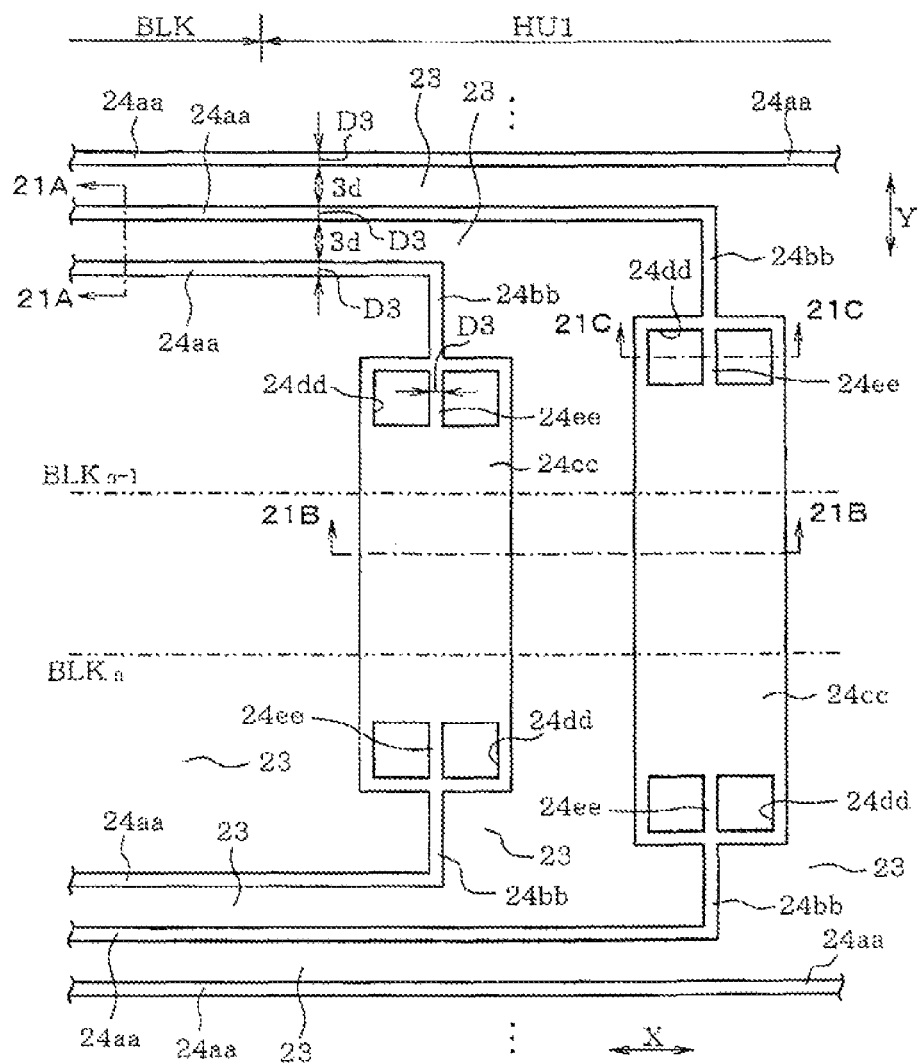
FIG. 20 is an example of a plan view of one step of the manufacturing process illustrating the fringe pattern portion of FIG. 4 (Part 8).
Figure 21A:
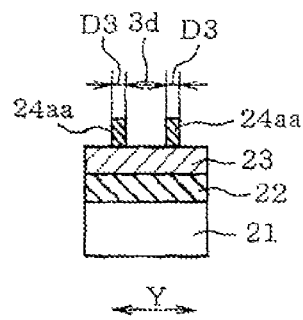
FIG. 21A is an example of a schematic cross-sectional view of a portion taken along line 21A-21A in FIG. 20.
Figure 21B:
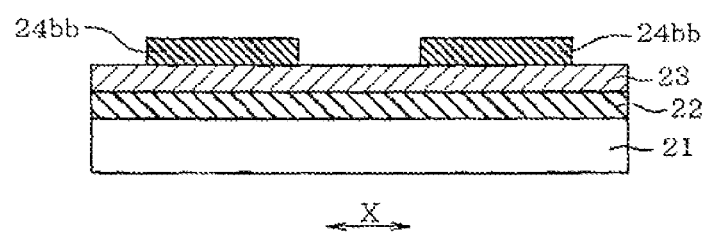
FIG. 21B is an example of a schematic cross-sectional view of a portion taken along line 21B-21B in FIG. 20.
Figure 21C:
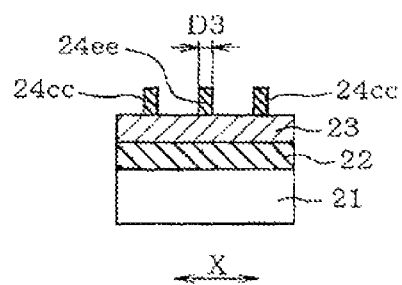
FIG. 21C is an example of a schematic cross-sectional view of a portion taken along line 21C-21C in FIG. 20.
Figure 22:
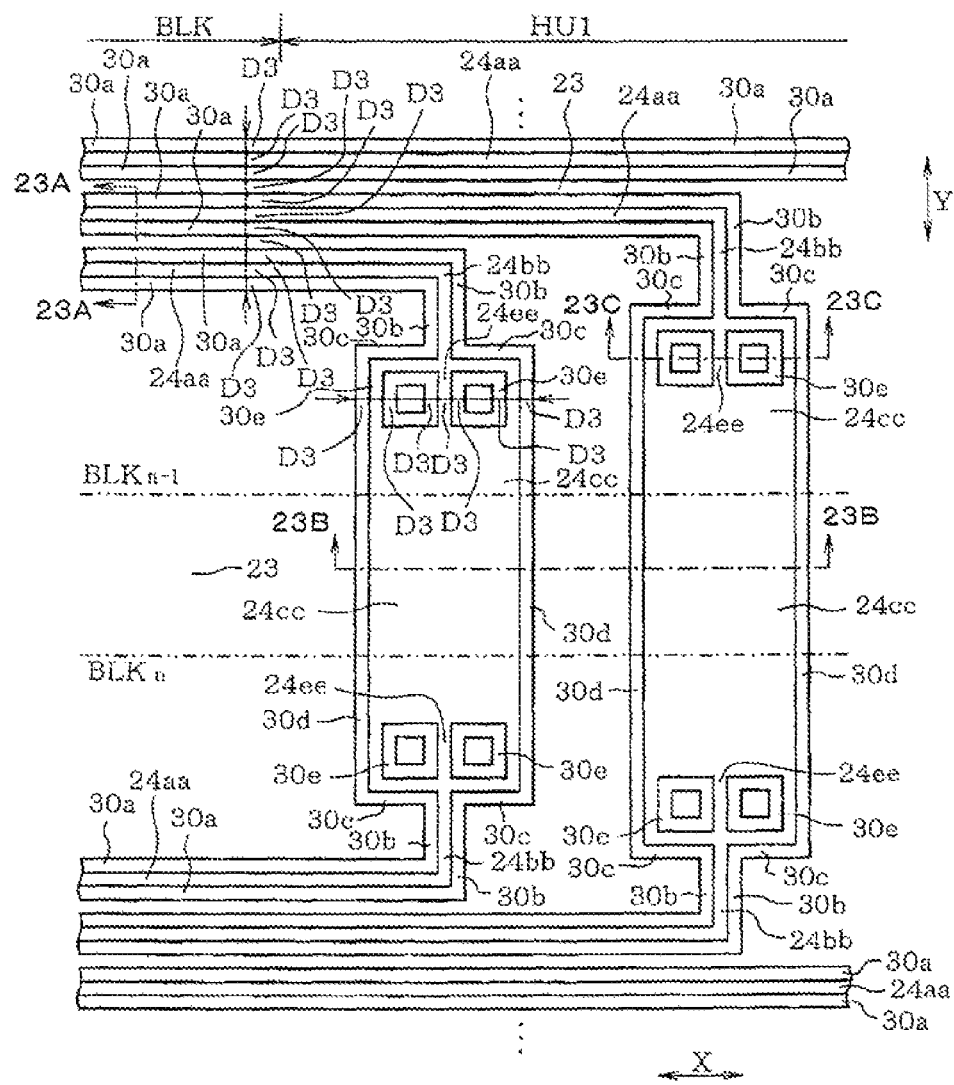
FIG. 22 is an example of a plan view of one step of the manufacturing process illustrating the fringe pattern portion of FIG. 4 (Part 9).
Figure 23A:
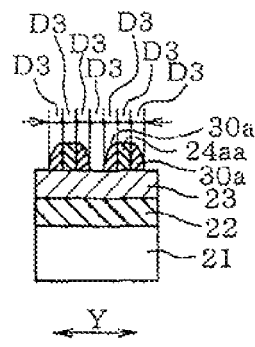
FIG. 23A is an example of a schematic cross-sectional view of a portion taken along line 23A-23A in FIG. 22.
Figure 23B:
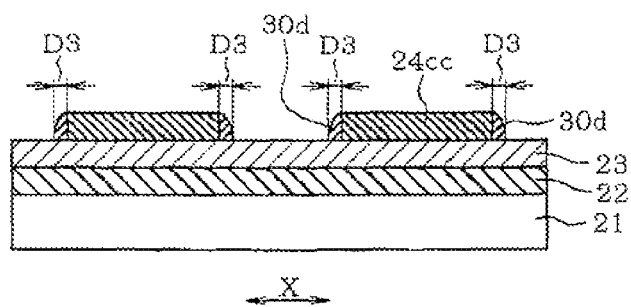
FIG. 23B is an example of a schematic cross-sectional view of a portion taken along line 23B-23B in FIG. 22.
Figure 23C:
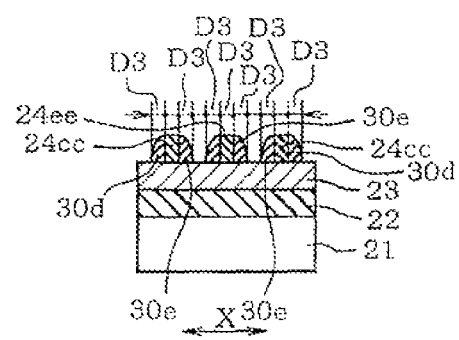
FIG. 23C is an example of a schematic cross-sectional view of a portion taken along line 23C-23C in FIG. 22.
Figure 24:
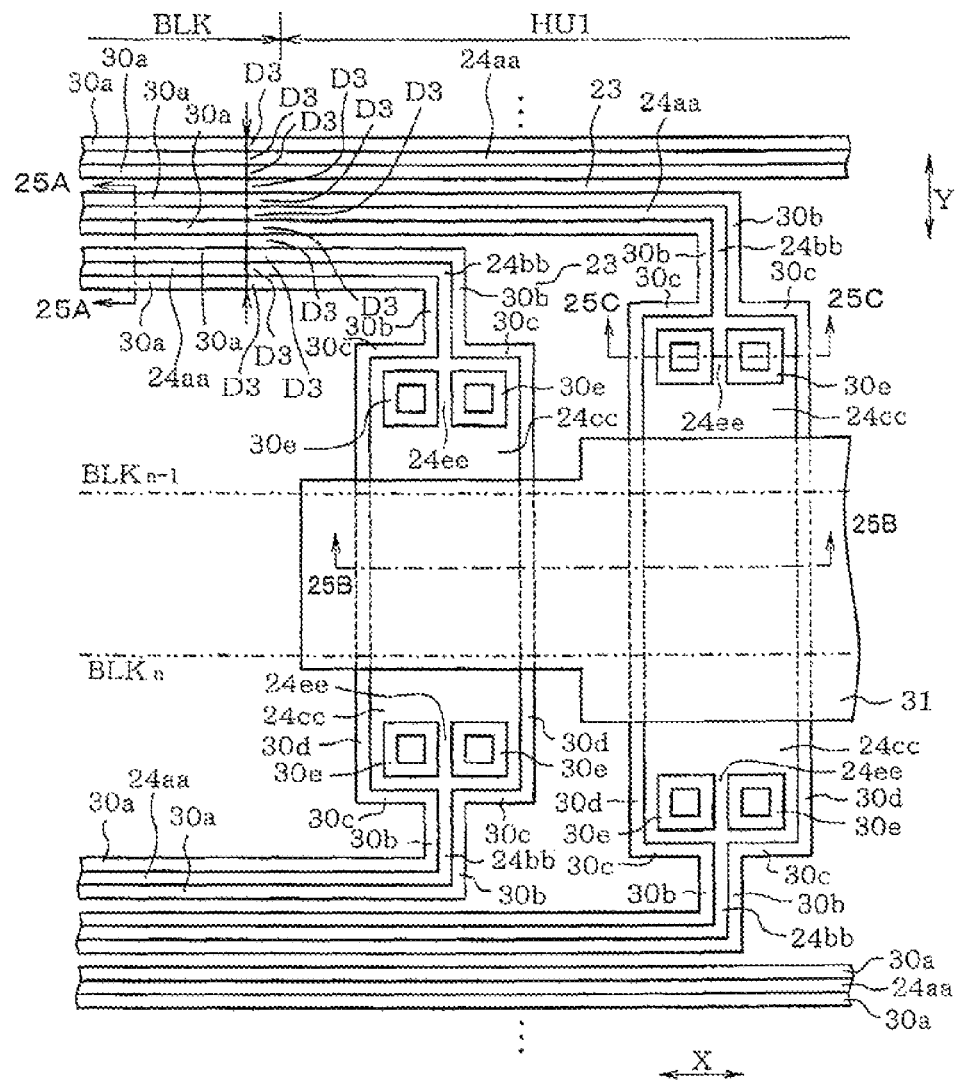
FIG. 24 is an example of a plan view of one step of the manufacturing process illustrating the fringe pattern portion of FIG. 4 (Part 10).
Figure 25A:
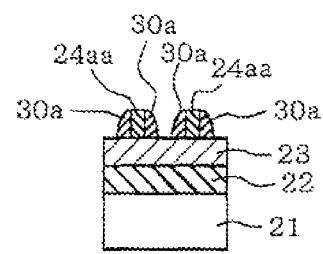
FIG. 25A is an example of a schematic cross-sectional view of a portion taken along line 25A-25A in FIG. 24.
Figure 25B:
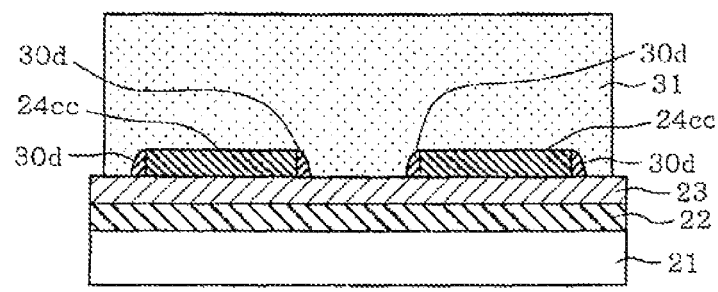
FIG. 25B is an example of a schematic cross-sectional view of a portion taken along line 25B-25B in FIG. 24.
Figure 25C:
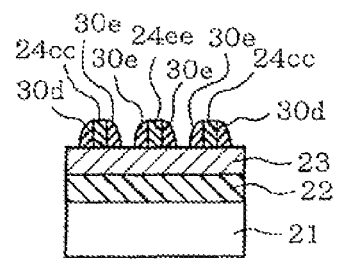
FIG. 25C is an example of a schematic cross-sectional view of a portion taken along line 25C-25C in FIG. 24.
Figure 26:
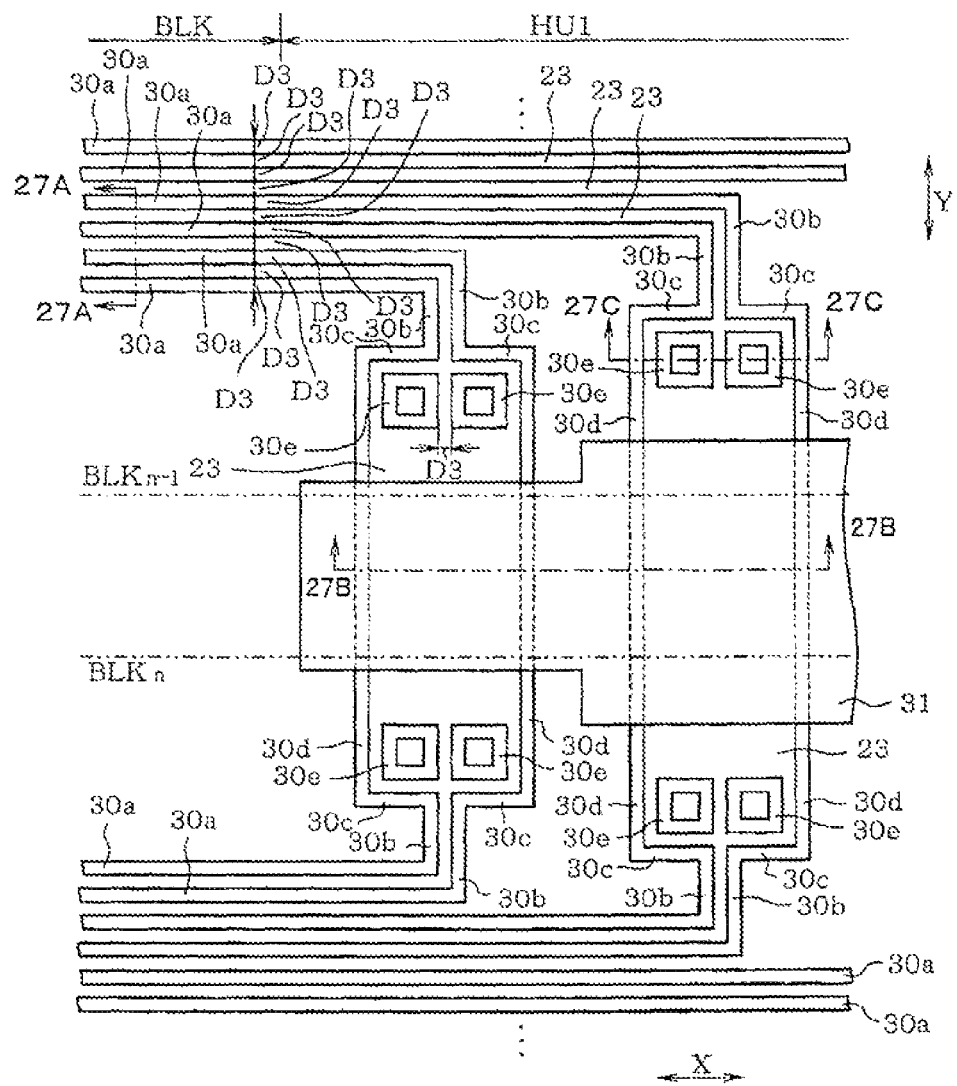
FIG. 26 is an example of a plan view of one step of the manufacturing process illustrating the fringe pattern portion of FIG. 4 (Part 11).
Figure 27A:
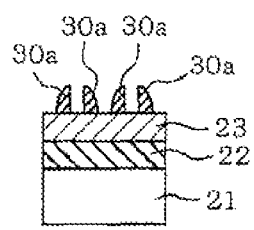
FIG. 27A is an example of a schematic cross-sectional view of a portion taken along line 27A-27A in FIG. 26.
Figure 27B:
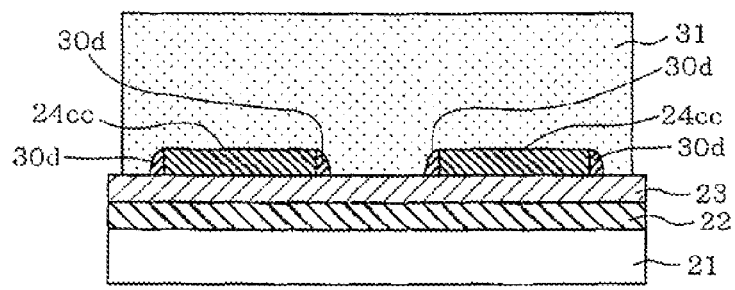
FIG. 27B is an example of a schematic cross-sectional view of a portion taken along line 27B-27B in FIG. 26.
Figure 27C:
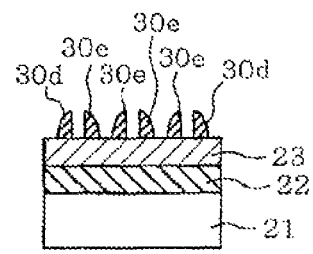
FIG. 27C is an example of a schematic cross-sectional view of a portion taken along line 27C-27C in FIG. 26.
Figure 28:
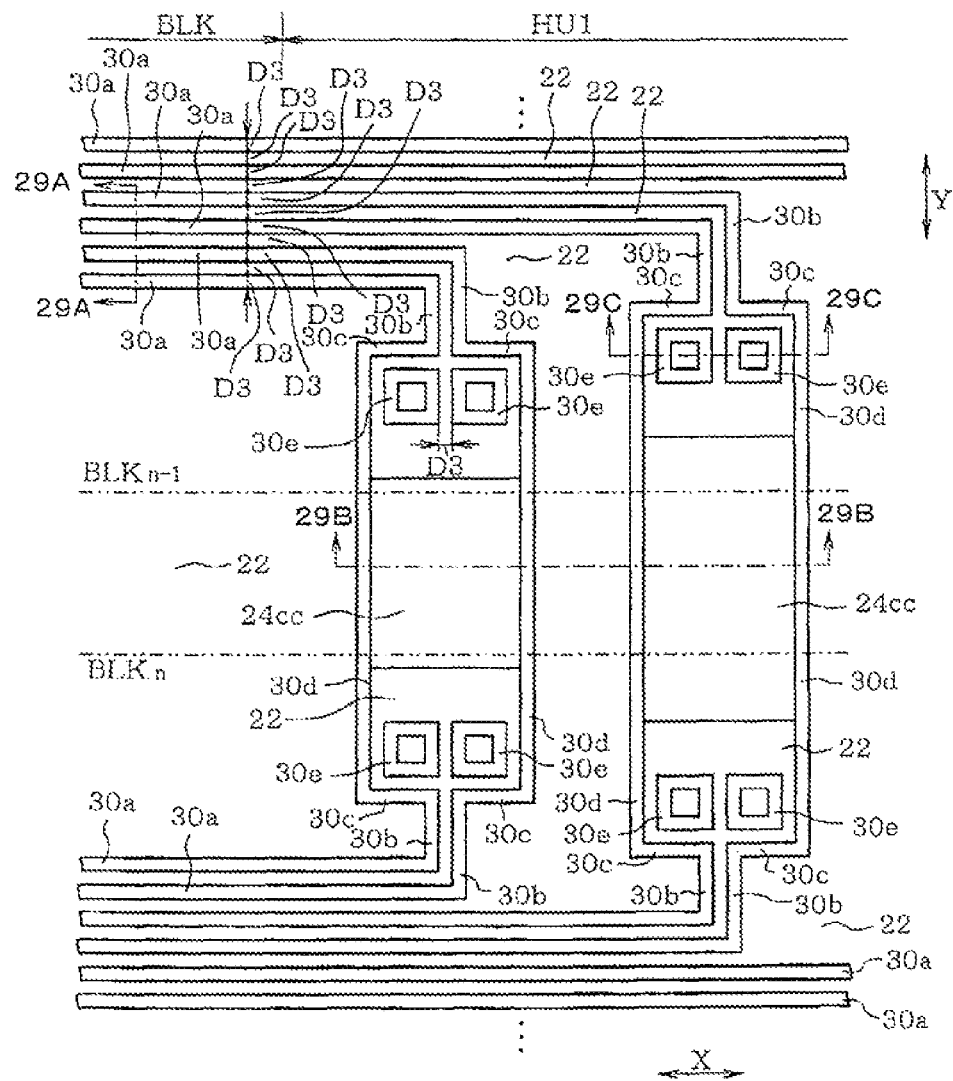
FIG. 28 is an example of a plan view of one step of the manufacturing process illustrating the fringe pattern portion of FIG. 4 (Part 12).
Figure 29A:
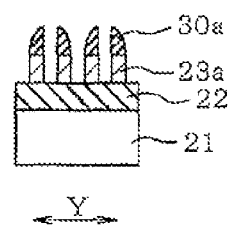
FIG. 29A is an example of a schematic cross-sectional view of a portion taken along line 29A-29A in FIG. 28.
Figure 29B:
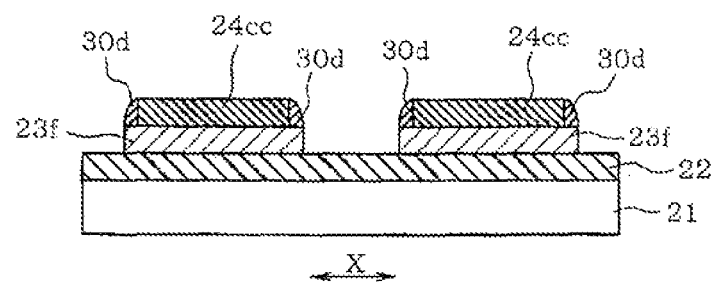
FIG. 29B is an example of a schematic cross-sectional view of a portion taken along line 29B-29B in FIG. 28.
Figure 29C:
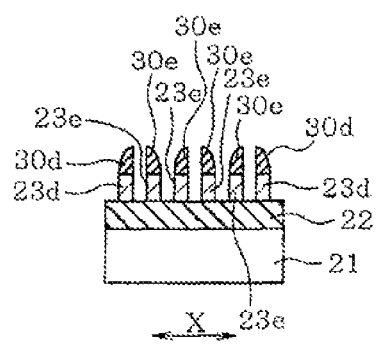
FIG. 29C is an example of a schematic cross-sectional view of a portion taken along line 29C-29C in FIG. 28.

Next, as illustrated in FIGS. 14, 15A, and 15B, the hard mask film 25 is pattern etched using the first side wall patterns 28a and 28b as masks using an RIE method to thereby form hard mask patterns 25a and 25b in the hard mask layer having the same width and pattern as that of the first side wall patterns 28, 28b. The second core material film 24 which is a ground layer under the hard mask film 25 is thus exposed between the lines of the hard mask patterns 25a and 25b. In this case, a material capable of setting a large etch selectivity with respect to the first side wall patterns 28a and 28b, i.e., is readily etched as compared to the material of the sidewall patterns 28a, 28b, is used as the hard mask film 25.

For example, when first core material patterns 26aa and 26bb are silicon oxide films and the first side wall patterns 28a and 28b are either amorphous silicon films or polycrystalline silicon films, a silicon nitride film may be used for the hard mask patterns 25a and 25b. In addition, when the first core material patterns 26aa and 26bb are silicon oxide films and first side wall patterns 28a and 28b are silicon nitride films, either an amorphous silicon film or a polycrystalline silicon layer may be used for the hard mask patterns 25a and 25b. When the first core material patterns 26aa and 26bb are organic material films and the first side wall patterns 28a and 28b are either low-temperature oxide films or low-temperature silicon nitride films, any of an amorphous silicon film, a polycrystalline silicon film, and a silicon nitride film may be used for the hard mask patterns 25a and 25b.

Next, as illustrated in FIG. 16 and FIGS. 17A to 17C, a resist pattern 29 for forming the fringe pattern and the dummy pattern (FIG. 4) is formed over the first side wall pattern 28b in extraction region HU1. A resist film is patterned by a photolithography technique, and patterning is thus performed thereon to form the resist pattern 29. The resist pattern 29, having a long rectangular shape, is disposed so as to overlap an upper portion of the first side wall pattern 28b in the extraction region HU1, and is formed up to a position extending to both ends of the first side wall pattern 28b.

Further, the resist pattern 29 is provided with openings 29a and 29b in the vicinity of both ends of the extraction region HU1 in the Y direction so as to expose a portion of the first side wall pattern 28b in the openings 29a, 29b. The dummy pattern DP will be located in the opening 29b as among the openings 29a and 29b, and the dummy pattern DP is formed, and is then removed, except for the portion thereof at the opening 29a.

In the resist pattern 29 mentioned above, the widths of outer circumferential portions of the opening portions 29a and 29b may be set to be small, in a range of dimensions in which the resist pattern is capable of being formed by a standard photolithography techniques. When an opening width in the Y direction of each of the openings 29a and 29b is set as $\alpha$, the width of each frame portions, i.e., the remaining resist at the upper end of openings 29a and the lower side of opening 29b, in the Y direction, is $\beta$, and a width of the adjacent resist in the X direction forming a frame portions $\gamma$, the following sizes may be formed by a pattern formation technique.

For example, when a general ArF dry exposure apparatus is used, minimum attainable feature sizes are approximately $100 \leq \alpha \leq 200$ nm and $\beta$ and $\gamma=100$ nm. In addition, when a highly-accurate exposure technique such as that possible in an ArF immersion exposure apparatus, an extreme ultraviolet (EUV) exposure apparatus, or a nano imprint lithography (NIL) apparatus is used, the sizes of $\alpha$, $\beta$, and $\gamma$ are further reduced.

However, when the sizes of $\beta$ and $\gamma$ are greater than or equal to 100 nm, there is the possibility of the opening portions 29a and 29b not being able to be formed. In this case, it is not possible to suppress re-deposition, and thus there is the possibility that the suppression of a short-circuit between adjacent word lines and approaching of an adjacent wiring might not be achieved. For this reason, the approximate relationships of $0<\alpha \leq 200$ nm and $0<\beta$, $\gamma<100$ nm are established with an exposure limit of an ArF dry exposure apparatus as an upper limit.

Next, the second core material film 24 is processed using the first side wall patterns 28a and 28b and the resist pattern 29 as masks to thereby form second core material patterns 24a, 24b, and 24c as illustrated in FIG. 18 and FIGS. 19A to 19C. Here, the second core material patterns 24a, 24b, and 24c are formed by etching the second core material film 24. The second core material pattern 24a is a portion having a line-and-space pattern in a portion in which the word lines WL are formed in the memory cell region. The second core material pattern 24b is a portion in which the second core material pattern 24a extends in the Y direction in the extraction region HU1. The second core material pattern 24c is a portion in which the fringe pattern FP connected to the second core material pattern 24b is formed.

Thus, the conductive film 23 as a base is exposed in a portion other than a portion in which the second core material patterns 24a, 24b, and 24c are formed. Meanwhile, in both ends of the second core material pattern 24c, two openings 24d are formed in a portion in which the dummy pattern DP is formed.

Thereafter, the resist pattern 29 used as an etching mask is peeled off, and then the first side wall patterns 28a and 28b and the hard mask patterns 25a and 25b extending on second core material pattern 24c are selectively etched and thus removed. In this case, the first side wall patterns 28a and 28b and the hard mask patterns 25a and 25b may be etched by wet etching or dry etching using a reactive ion etching (RIE) method.

For example, when the hard mask patterns 25a and 25b are silicon nitride films, for example, hot phosphoric acid (Hot $H_3PO_4$) is used in wet etching. In addition, when the hard mask patterns 25a and 25b are silicon films, Hot trimethyl(2-hydroxyethyl)ammonium hydroxide (TMY) is used in wet etching or etching such as a chemical dry etching (CDE) method or an RIE method.

As a result, as illustrated in FIG. 18 and FIGS. 19A to 19C, the second core material pattern 24a may be formed in the memory cell region and extend from the memory cell region to the extraction region HU1. In addition, the second core material pattern 24c may be formed in a region where the fringe pattern FP of the extraction region HU1 is formed. At both ends of the second core material pattern 24c in the Y direction, two sacrificial opening portions 24d extending between, in the X direction, the left hand and center core material pattern 24c and between the right hand and center core material pattern 24c are formed on each portion in which the dummy pattern DP is formed, to form the inner opening portion of the dummy patterns to be formed.

The two opening portions 24d are disposed symmetrically on the right and left sides with respect to a second core material pattern 24e extending therebetween, having a width size of D2 (=2d), which extends in the Y direction in the center of the region where the dummy pattern DP is to be formed. In addition, the second core material pattern 24c formed in the opening portion 24d is formed by the hard mask pattern 25b which is exposed to the opening portion 24d. As a result, the second core material pattern 24e is an extension of the second core material pattern 24b in the extraction region.

Next, as illustrated in FIG. 20 and FIGS. 21A to 21C, the second core material patterns 24a, 24b, 24c, and 24e are subjected to slimming. In this case, the amount of slimming is approximately half (=d/2) of D3 (=d). Thus, each pattern is slimmed from both sides thereof by a width of D3 as a whole and thus has a width size of D3 (=d=D2/2). Accordingly, in a portion in which a second core material pattern 24aa is formed in a region where a line-and-space pattern is formed, the interval between the second core material patterns 24aa is 3d.

In the above-mentioned slimming, when the second core material patterns 24aa, 24bb, 24cc, and 24ee are silicon oxide films, for example, wet etching using hydrogen fluoride (HF) or dry etching using an RIE method may be used. In addition, when the second core material patterns 24aa, 24bb, 24cc, and 24ee are organic material films, dry etching using an RIE method or plasma etching using oxygen ($O_2$) or ozone ($O_3$) may be used.

Next, as illustrated in FIG. 22 and FIGS. 23A to 23C, second side wall patterns 30a to 30e having a width d are formed on side walls of the second core material patterns 24aa, 24bb, 24cc, and 24ee, respectively. In this process, first, a second side wall film is conformally formed on the entire surface with a film thickness of d (=D3) to cover the second core material patterns 24aa, 24bb, 24cc, and 24ee and the exposed conductive film 23 which is a base. Subsequently, the second side wall film is processed by etch back processing in an etch back amount of d. Thus, the second side wall patterns 30a to 30e may be formed in the side wall portions of the second core material patterns 24aa, 24bb, 24cc, and 24ee so as to have a width of D3.

Here, for example, when the films of the second core material patterns 24aa, 24bb, 24cc, and 24ee are silicon oxide films, an amorphous silicon film, a polycrystalline silicon film, a silicon nitride film, or the like may be used as films for forming the second side wall patterns 30a to 30e. In addition, when the films of the second core material patterns 24aa, 24bb, 24cc, and 24ee are organic material films, a low-temperature silicon oxide film, a low-temperature silicon nitride film, or the like may be used as films for forming the second side wall patterns 30a to 30e.

As a result, a portion of the second core material patterns 24aa extending from within the blocks BLKn and BLKn−1 to the extraction region HU1 is in a state where a line pattern, which is configured with the second core material pattern 24aa having a width size of D3 (=d) and the second side wall layer pattern 30a formed on both side surfaces thereof in the Y direction, is disposed. In addition, a disposition interval between portions in which the second core material pattern 24aa is not disposed between two second side wall layer patterns 30a is set to D3 (=d). In the extraction region HU1, a second side wall pattern 30b having a width of D3 is formed on both side walls of the second core material pattern 24bb extending in the Y direction and also where second side wall patterns 30c, 30d, and 30e having a width of D3 are disposed in the vicinity of the second core material pattern 24cc and on the side wall of the opening portion 24dd.

Next, as illustrated in FIG. 24 and FIGS. 25A to 25C, a resist pattern 31 having a stepped rectangular shape is formed to cover the second core material pattern 24cc and the second side wall pattern 30d in a region for forming the fringe pattern FP in the extraction region HU1, i.e., generally extending from adjacent extraction regions associated with adjacent blocks BLKn and BLKn−1, and across a border region therebetween. In this case, the rectangular portion covered by the resist pattern 31 may be formed in a state where the portion is connected to a rectangular covered portion adjacent thereto. In addition, the rectangular portion covered by the resist pattern 31 is disposed so as to cover a position separated at a predetermined distance from a portion in which the second side wall pattern 30e for forming the dummy pattern DP is disposed.

Next, as illustrated in FIG. 26 and FIGS. 27A to 27C, the second core material patterns 24aa, 24bb, 24cc, and 24ee in the exposed portion, i.e., that portion of the extraction portion HU1 adjacent to blocks BLKn and BLKn−1 not covered by the resist layer 31 are selectively removed by etching. Thus, the second side wall pattern 30a extending in the X direction within the blocks BLKn and BLKn−1 and the extraction portion HU1 is formed as a line-and-space pattern having a width size of D3 (=d) and a disposition interval of D3 to form word lines WL.

In the extraction region HU1, two pairs of second side wall patterns 30b, having a width of D3, which extend in the Y direction are formed at an interval (spacing) therebetween of D3. The two pairs of second side wall patterns 30b are connected to their associated second side wall patterns 30c which extend in the X direction. The second side wall patterns 30c are connected to the second side wall patterns 30d which again extend in the Y direction. Similarly, in a region surrounded by the second side wall patterns 30c and 30d, the second side wall pattern 30e having a width of D3 and a rectangular ring shape is disposed.

Next, as illustrated in FIG. 28 and FIGS. 29A to 29C, the resist pattern 31 is removed by asking. Thereafter, the conductive film 23 as a base is etched using an RIE method by using the second core material pattern 24cc and the second side wall pattern 30a to 30d, which remain between the second side wall patterns 30b in the form of a rectangle, as masks.

Thus, in the conductive film 23, conductor patterns 23a corresponding to the word lines WL of the line-and-space pattern are formed with a width size of D3 (=d) and at disposition intervals of D3 and extend in the X direction in the block region BLK of the memory cell. In the extraction region HU1, two conductor patterns (disposed below wall pattern 30b), having a width size of D3 and which extend in the Y direction are formed at an interval D3. The two conductor patterns 23b (disposed below wall pattern 30b) are connected to conductor patterns 23c (disposed below wall pattern 30c), respectively, which extend in the X direction. The conductor patterns 23c are connected to conductor patterns 23d (FIG. 29c), respectively, which again extend therefrom in the Y direction.

A conductor pattern 23f having a rectangular shape is formed in a portion in which the second core material pattern 24bb is formed between two conductor patterns 23d extending in the Y direction. In the vicinity of both ends in the Y direction) of the conductor pattern 23b (disposed below wall pattern 30b), two conductor patterns 23e (disposed below wall pattern 30e) having a rectangular ring shape are similarly disposed with a width of D3 in a region surrounded by the conductor patterns 23c and 23d.

Figure 30:
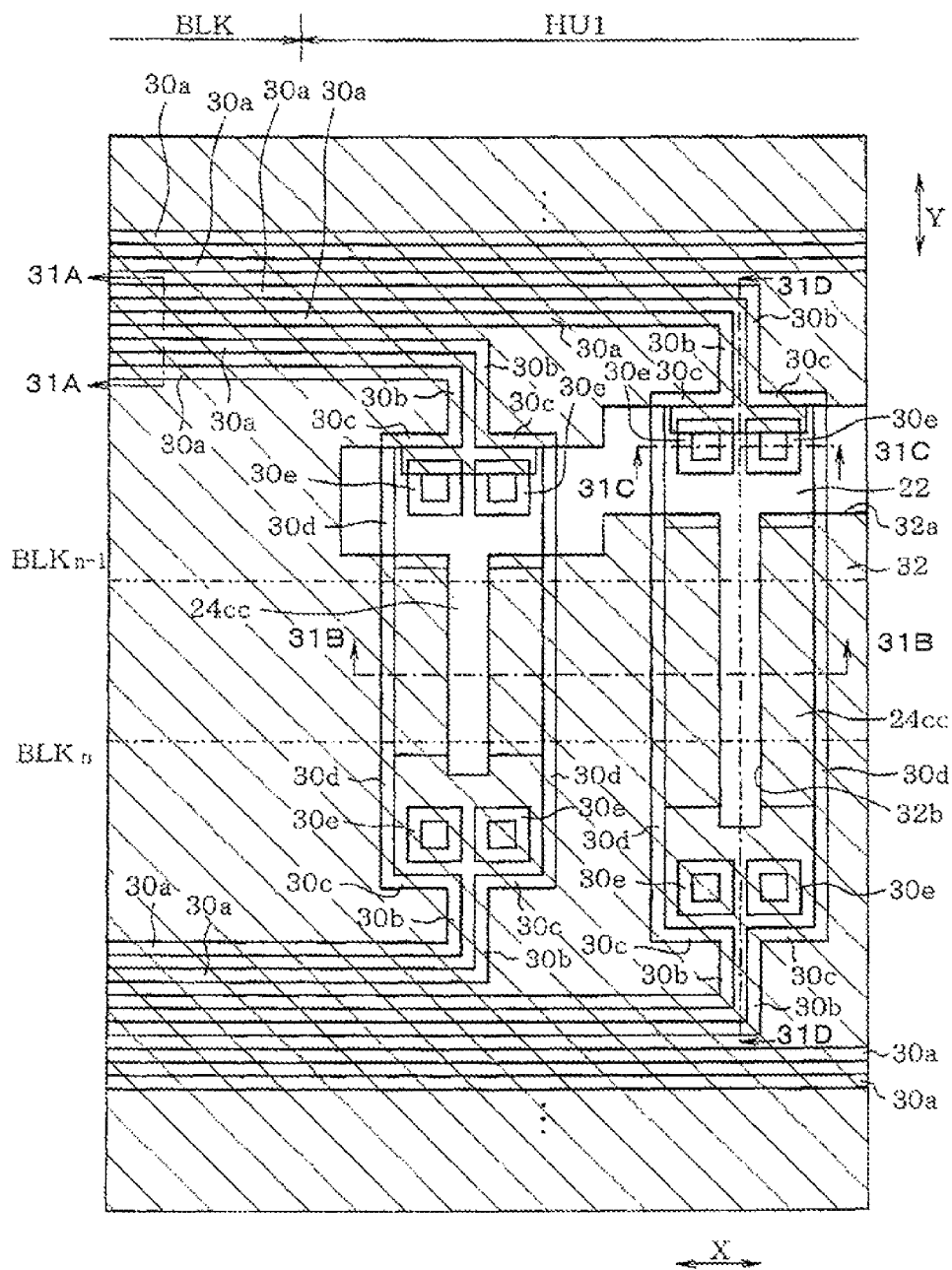
FIG. 30 is an example of a plan view of one step of the manufacturing process illustrating the fringe pattern portion of FIG. 4 (Part 13).
Figure 31A:
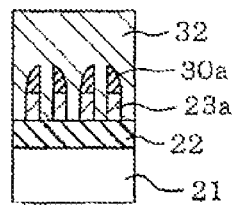
FIG. 31A is an example of a schematic cross-sectional view of a portion taken along line 31A-31A in FIG. 30.
Figure 31B:
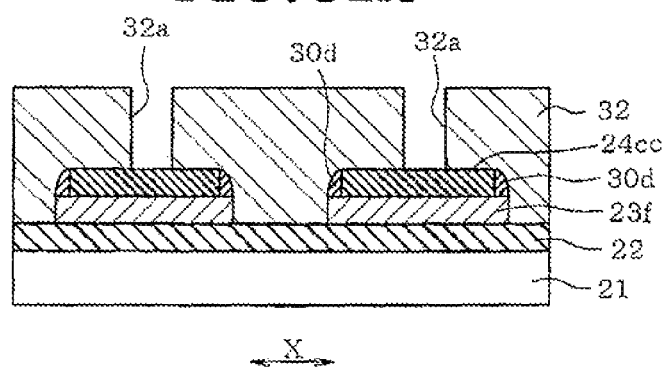
FIG. 31B is an example of a schematic cross-sectional view of a portion taken along line 31B-31B in FIG. 30.
Figure 31C:
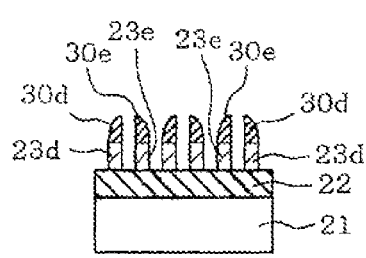
FIG. 31C is an example of a schematic cross-sectional view of a portion taken along line 31C-31C in FIG. 30.
Figure 31D:
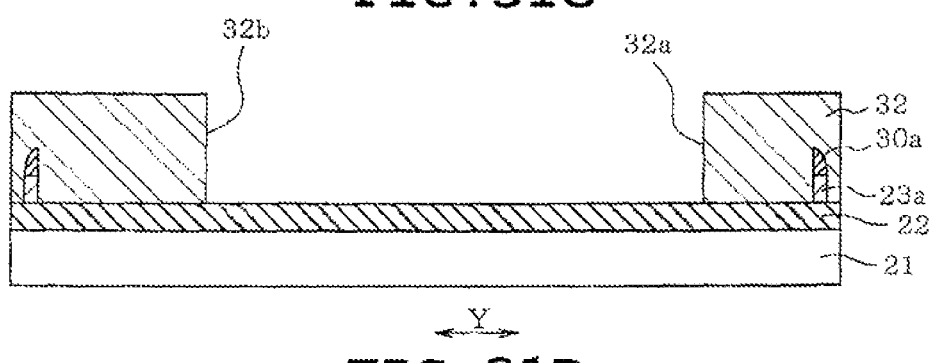
FIG. 31D is an example of a schematic cross-sectional view of a portion taken along line 31D-31D in FIG. 30.
Figure 32:
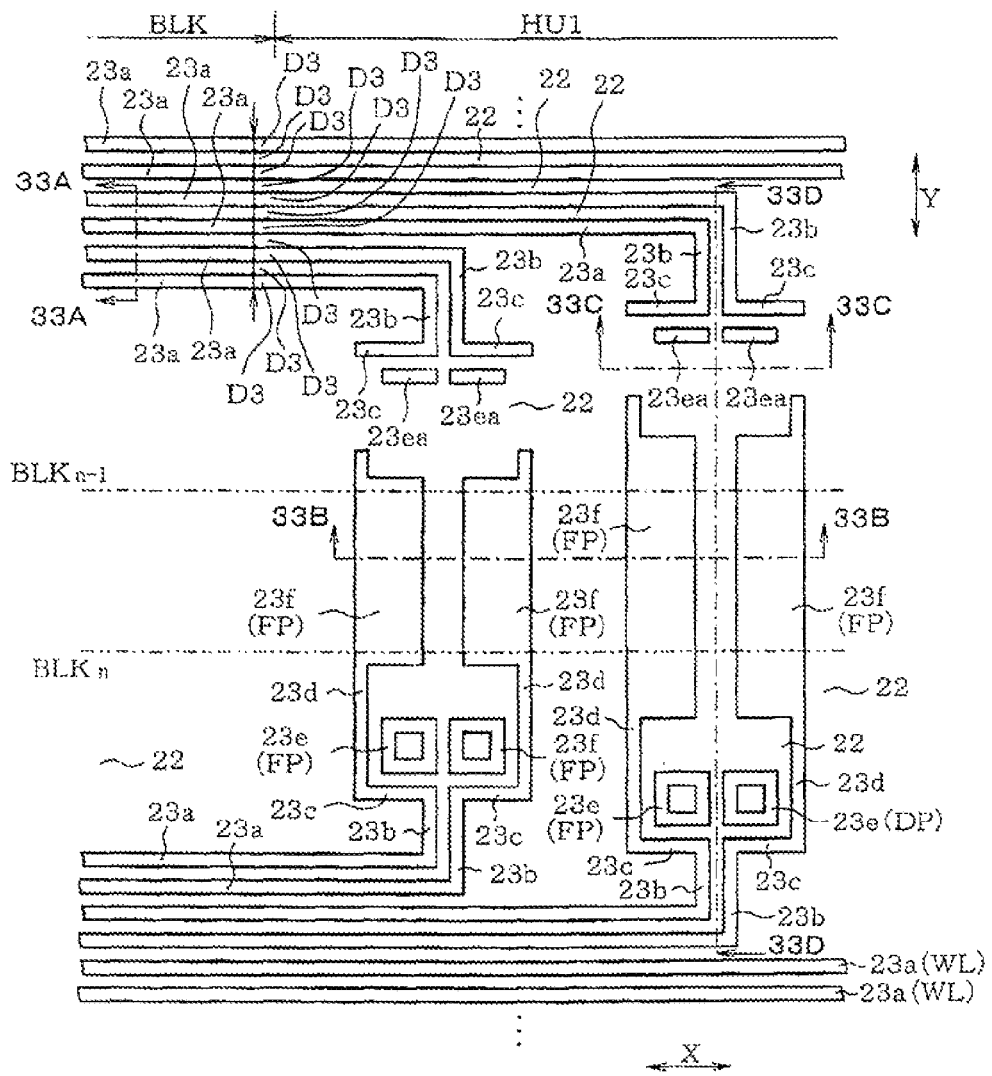
FIG. 32 is an example of a plan view of one step of the manufacturing process illustrating the fringe pattern portion of FIG. 4 (Part 14).
Figure 33A:
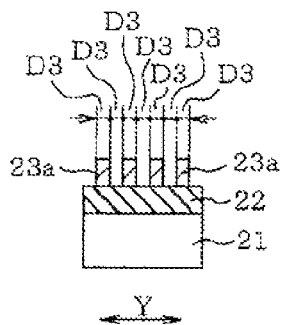
FIG. 33A is an example of a schematic cross-sectional view of a portion taken along line 33A-33A in FIG. 32.
Figure 33B:
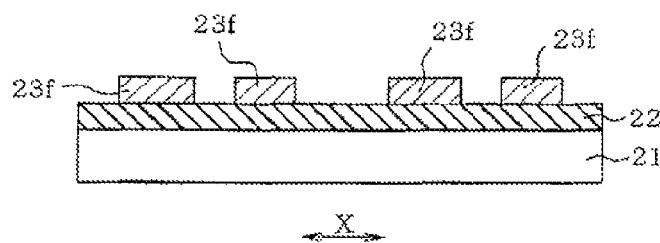
FIG. 33B is an example of a schematic cross-sectional view of a portion taken along line 33B-33B in FIG. 32.
Figure 33C:
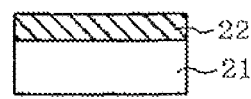
FIG. 33C is an example of a schematic cross-sectional view of a portion taken along line 33C-33C in FIG. 32.
Figure 33D:
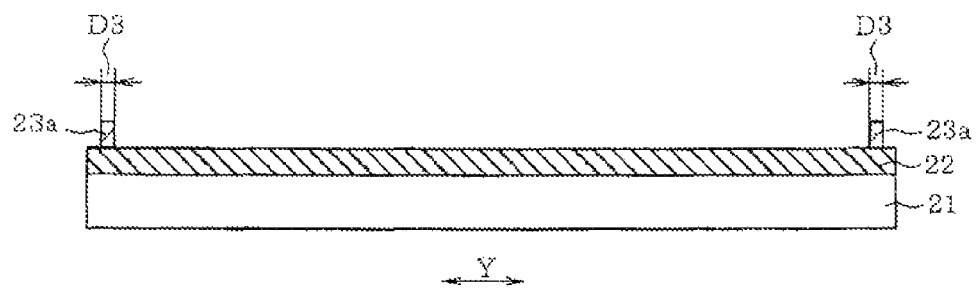
FIG. 33D is an example of a schematic cross-sectional view of a portion taken along line 33D-33D in FIG. 32.
Figure 34:
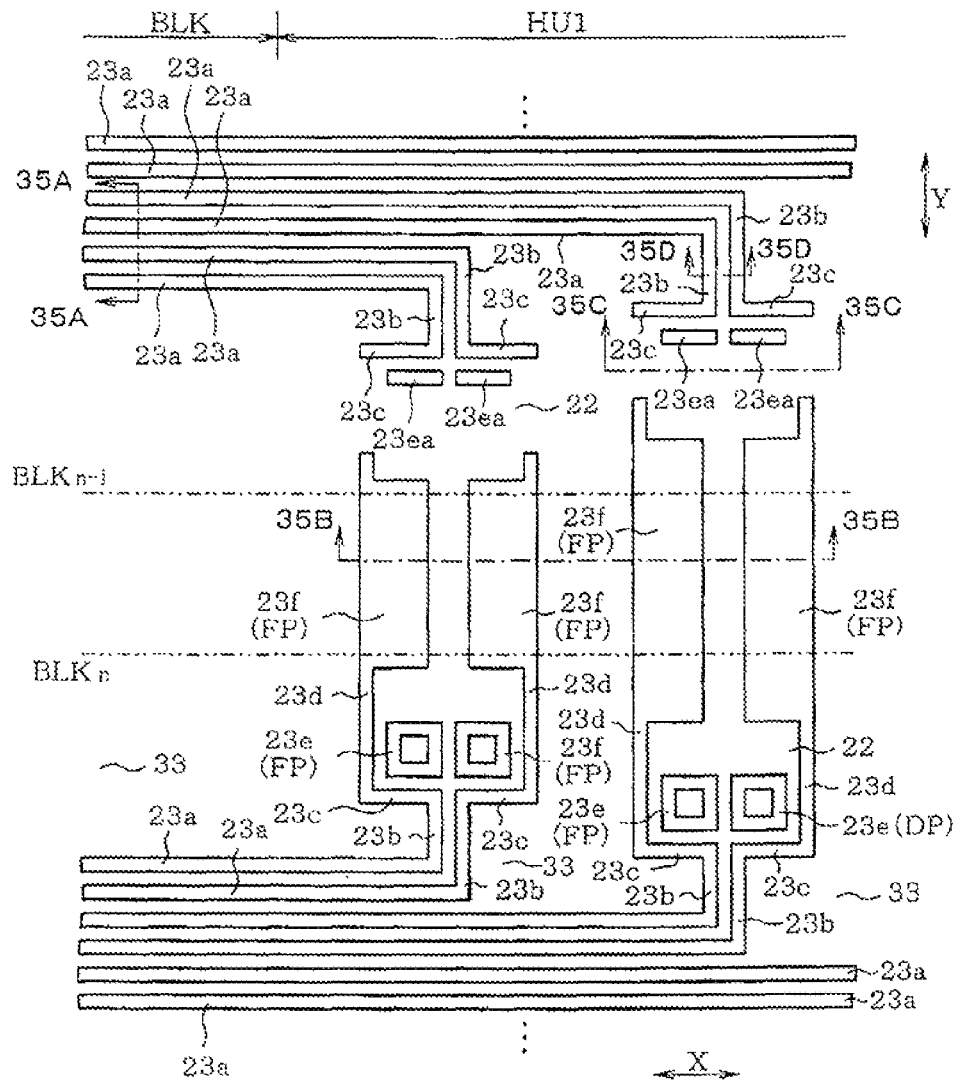
FIG. 34 is an example of a plan view of one step of the manufacturing process illustrating the fringe pattern portion of FIG. 4 (Part 15).
Figure 35A:
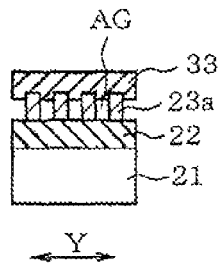
FIG. 35A is an example of a schematic cross-sectional view of a portion taken along line 35A-35A in FIG. 34.
Figure 35B:
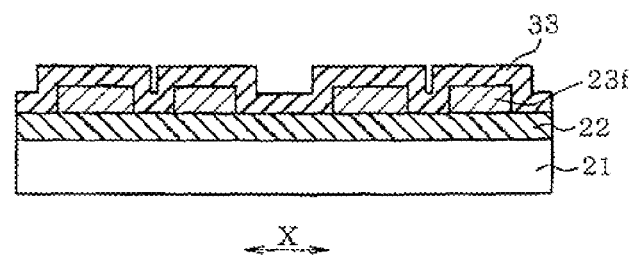
FIG. 35B is an example of a schematic cross-sectional view of a portion taken along line 35B-35B in FIG. 34.
Figure 35C:
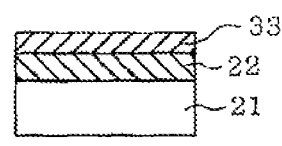
FIG. 35C is an example of a schematic cross-sectional view of a portion taken along line 35C-35C in FIG. 34.
Figure 35D:
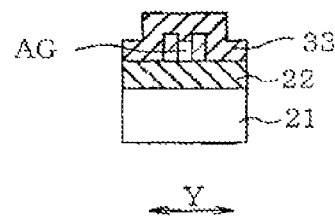
FIG. 35D is an example of a schematic cross-sectional view of a portion taken along line 35D-35D in FIG. 34.

Next, as illustrated in FIG. 30 and FIGS. 31A to 31D, a resist pattern 32 is formed over the features, as shown in hatched outline in FIG. 30. The resist pattern 32 is used to divide a portion of the remaining conductor pattern which has a rectangular shape into the fringe pattern FP of the block BLKn. In order to divide the conductor pattern 23b as the fringe pattern FP on the block BLKn side, the resist pattern 32 divides a portion of the remaining conductor pattern on the block BLKn−1 side and is provided with an opening 32a so as to partially remove a portion the conductor pattern 23f having a rectangular shape present in the extraction region corresponding to block BLKn−. In addition, a slit shaped opening 32b is formed in the resist and extends in the Y direction in order to divide the conductor pattern 23d in the X direction.

Next, as illustrated in FIG. 32 and FIGS. 33A to 33D, the conductor pattern 23f is formed from the conductor film 23 by etching using the resist pattern 32 as a mask to thereby form the fringe pattern FP (23f). In the etching process, etching to remove the second core material pattern 24cc exposed to the opening 32b of the resist pattern 32 is performed to thereby expose the conductor pattern 23f. Subsequently, etching for removing the second side wall patterns 30d and 30e exposed to the opening 32a of the resist pattern 32 is performed to thereby expose the conductor patterns 23d and 23e.

Subsequently, the conductor patterns 23b and 23f exposed to the openings 32a and 32b of the resist pattern 32 are removed by etching. Further, thereafter, the resist pattern 32 is removed by asking. When the resist pattern 32 is removed, the second core material pattern 24cc remaining on the conductor pattern 23f and the second side wall patterns 30a to 30c remaining on the respective conductor patterns 23a to 23c are selectively removed by etching.

In the above-mentioned etching, etching the paired conductor patterns 23d which extend in the Y direction from both the blocks BLKn and BLKn−1, on the block BLKn−1 side is performed while leaving a portion the conductor pattern 23e serving as a dummy pattern in place. That is, the etching is performed by leaving a side portion 23ea of the conductor pattern 23e adjacent, and extending in the X direction parallel to, the conductor pattern 23c. As a result, as illustrated in FIG. 32 and FIGS. 33A to 33D, it is possible to form the conductor patterns 23a, having a width of D3, which form the word lines WL. In the extraction region HU1, the conductor patterns 23b, 23c, 23d, and 23f connected to the conductor patterns 23a of the block BLKn are formed. The conductor pattern 23f is formed as the fringe pattern FP. Further, the conductor pattern 23e as the dummy pattern DP is formed in a portion surrounded by the conductor patterns 23c and 23d. The conductor pattern 23f is separated from the conductor pattern 23d on the block BLKn−1 at an end of the fringe pattern FP in the Y direction, and thus is provided so as to function as the fringe pattern FP for the block BLKn side.

In the extraction region HU1, the conductor patterns 23a equivalent to the word lines WL on the block BLKn−1 side are connected to the conductor patterns 23b extending in the Y direction with the two thereof paired and the conductor patterns 23c which extend, in the X direction, in opposed directions from the end of the conductor 23b. The conductor pattern 23ea serving as a dummy pattern portion of one side of the conductor pattern 23e configuring the dummy pattern DP is disposed in the conductor pattern 23c so as to be separated therefrom at a predetermined distance in the Y direction.

Next, as illustrated in FIG. 34 and FIGS. 35A to 35D, an insulating film for forming an air gap is formed. This is for the purpose of using air or a vacuum as an insulating material so that mutual interference between the adjacent memory cell transistors in the memory cell region is less likely to occur, for example, when the conductor pattern 23a is used as the word line WL.

In the insulating film for forming an air gap, for example, a silicon oxide film 33 is formed by applying an inferior step coverage condition. Accordingly, the silicon oxide film 33 is not buried in portions having a disposition interval which is as small as D3, such as the conductor patterns 23a, and thus the portions remain as space portions. In this manner, when the silicon oxide film 33 is formed so as to span between adjacent upper portions of the conductor patterns 23a, the spaces between the conductor patterns 23a are formed as air gaps AG. Meanwhile, in a region having a disposition interval which is larger than D3, the silicon oxide film 33 enters, and thus film formation is performed without forming spaces. Thus, it is possible to form the air gap AG between the conductor patterns 23a.

As described above, after the conductor patterns 23a to 23f are processed, an interlayer insulating film and the like are formed by performing various types of processing. Further, as illustrated in FIG. 4, a contact is formed in the fringe pattern FP to thereby form an upper layer wiring.

According to the first embodiment, when etching is performed at the location where the dummy pattern DP is formed, the side portion 23ea of the dummy portion adjacent to the conductor pattern 23c is left in place, and thus it is possible to suppress the opening of the insulating film 33 forming an air gap AG at a location where the conductor patterns 23b extend in the extraction region HU1 and are respectively connected to the partial conductor patterns 23c and extend in the X direction.

Second Embodiment

Figure 36:
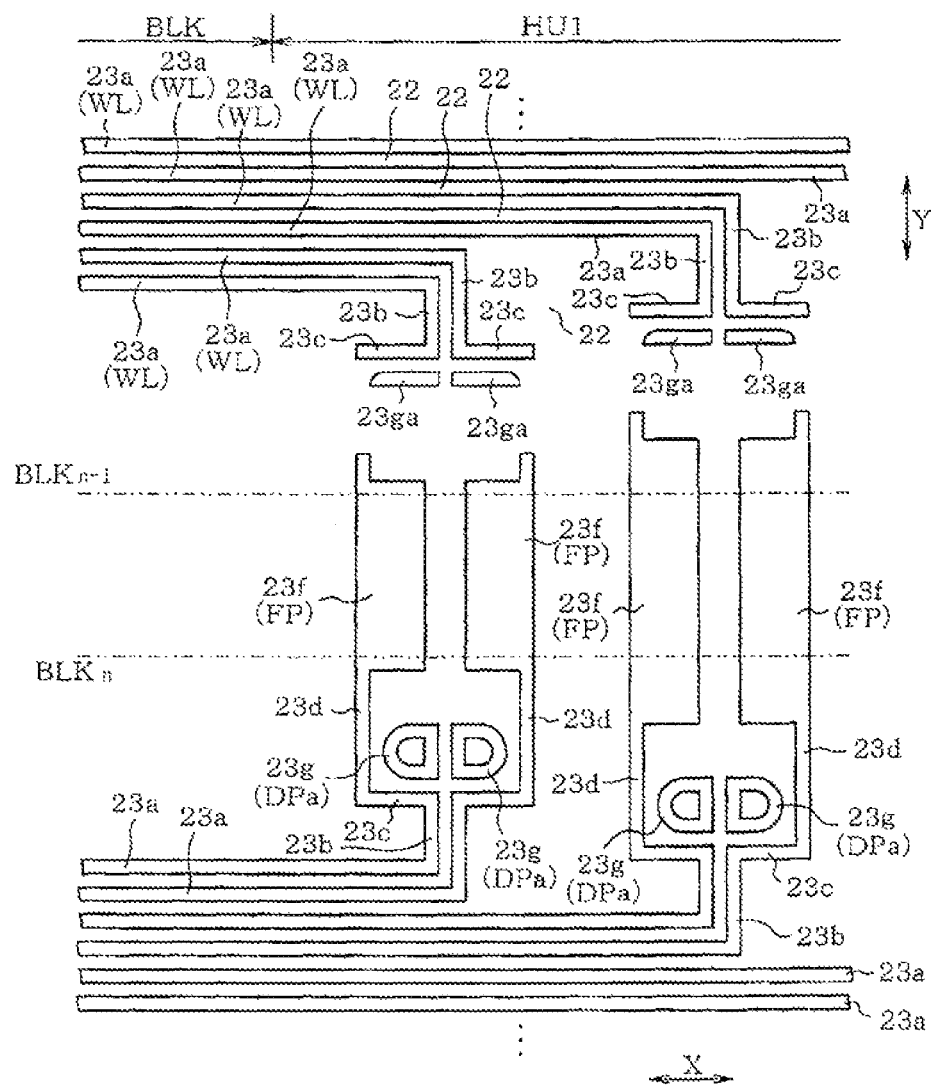
FIG. 36 is an example of a plan view illustrating a layout of a hookup region of word lines according to a second embodiment (Part 1).
Figure 37:
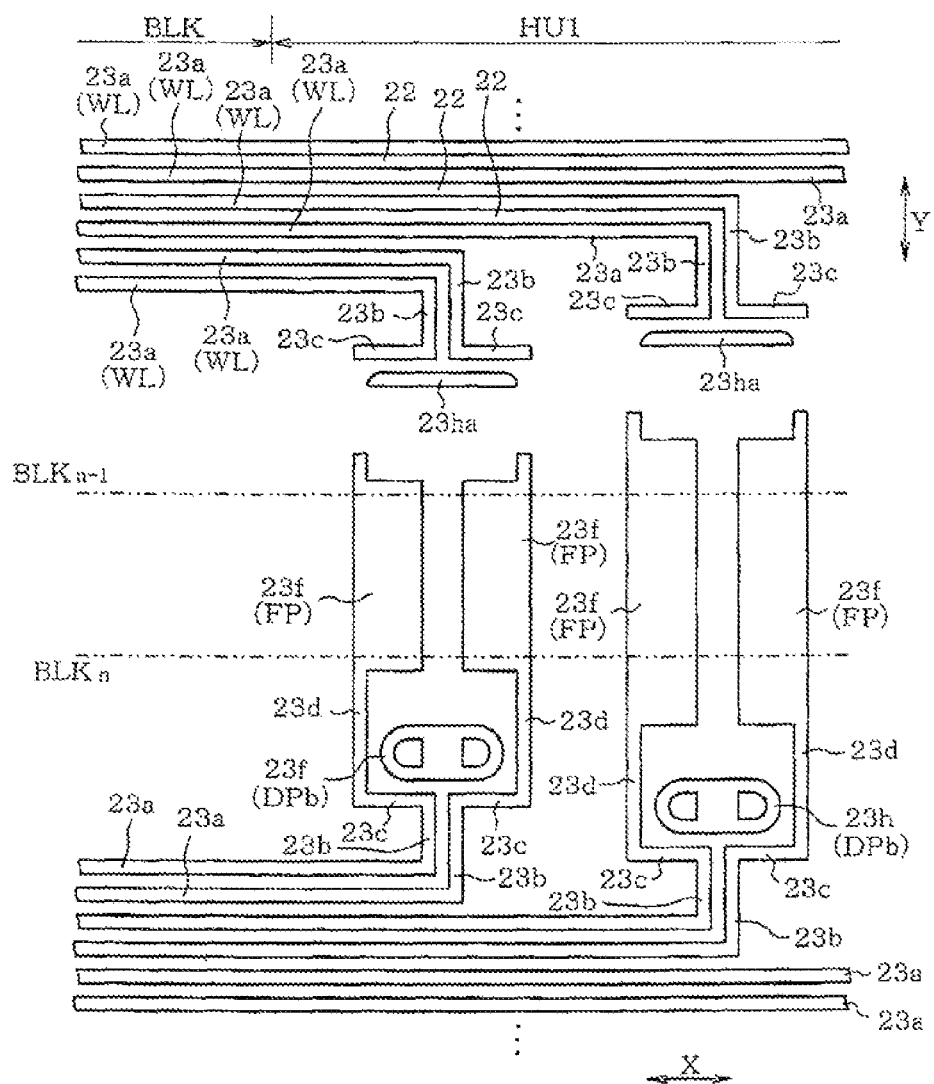
FIG. 37 is an example of a plan view illustrating a layout of a hookup region of word lines according to the second embodiment (Part 2).

FIGS. 36 and 37 illustrate a second embodiment. In this embodiment, the shapes of dummy patterns DP formed in an extraction region HU1 (HU2) are different from those of the first embodiment.

That is, in the example illustrated in FIG. 36, a conductor pattern 23g as a dummy pattern DPa is provided instead of the conductor pattern 23e as the dummy pattern DP. The pattern of the conductor pattern 23g for forming the dummy pattern DPa is a D-shaped ring instead of a rectangular ring shape. Two conductor patterns 23g are disposed such that straight line portions of the D shapes are adjacent to, and spaced from, each other.

Two conductor patterns 23g are disposed inside a portion surrounded by conductor patterns 23c and 23d on the block BLKn side. In addition, the conductor pattern 23g is divided by etching on the block BLKn−1 side so that only the side portion 23ga facing the conductor pattern 23c remains.

Even when the dummy pattern DPa using the conductor pattern 23g disposed in this manner is used, the same operational effects as those in the first embodiment may be obtained.

The dummy pattern DPa may be formed as a pattern in advance so as to have a D shape. Alternatively, a rectangular pattern set on a mask pattern may be formed to have a D shape during the formation thereof due to the occurrence of a difference in processing conversion.

Next, in the example illustrated in FIG. 37, a conductor pattern 23h as a dummy pattern DPb is provided instead of the dummy pattern DPa. While two conductor patterns 23g (dummy patterns DPa) illustrated in FIG. 36 are separated from each other at a distance D3, the conductor pattern 23h forming the dummy pattern DPb is formed as a pattern in which two dummy patterns DPa are combined so as to come into contact with each other at the straight line portions of the D shapes thereof.

Two conductor patterns 23h are disposed within conductor patterns 23c and 23d on the block BLKn side. In addition, the conductor pattern 23h on the block BLKn−1 side is partially removed by etching so that only a side portion 23ha facing the conductor pattern 23c remains.

Even when the dummy pattern DPb using the conductor pattern 23h disposed in this manner is used, the same operational effects as those in the first embodiment may be obtained.

Meanwhile, the dummy pattern DPb may be formed as a pattern in advance with D-shaped patterns connected to each other. Alternatively, a rectangular pattern or two D-shaped patterns, which are set on a mask pattern, may be formed such that the patterns are destroyed and deformed into D shapes during the formation thereof due to the occurrence of a difference in processing conversion and that the two patterns are connected to each other.

Third Embodiment

FIGS. 38A to 38J illustrate a third embodiment. In this embodiment, nine different modified patterns of the disposition and shape of the opening 32a of the resist pattern illustrated in FIG. 30 in the first embodiment are illustrated. Hereinafter, nine patterns of openings 32a1 to 32a9 respectively illustrated in FIGS. 38A to 38I will be described. Meanwhile, portions illustrated in FIGS. 38A to 38I illustrate a plan pattern of the extraction region HU1, illustrated in FIG. 3 or FIG. 4, on the block BLKn−1 side.

Figure 38A:
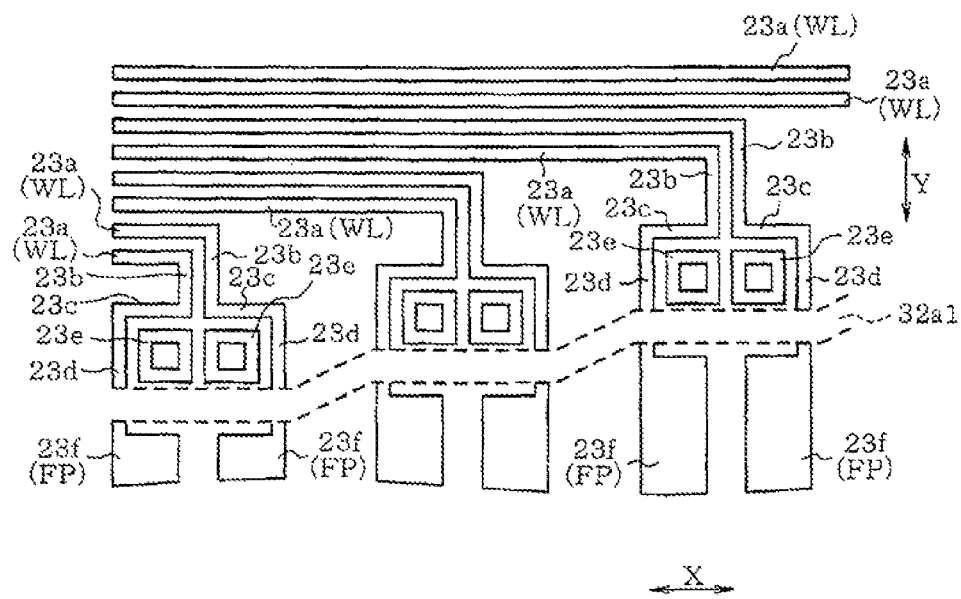
FIGS. 38A to 38J are examples of a plan view illustrating various patterns of a cutting position of a fringe pattern according to a third embodiment.

In FIG. 38A illustrating the extraction region HU1, the conductor patterns 23a corresponding to the word lines WL are formed so as to extend in the X direction with a width of D3. The interval (spacing) between the conductor patterns 23 in the Y direction is D3. The conductor patterns 23a are connected to the conductor patterns 23b which extend in the Y direction in pairs. The conductor patterns 23b extend in the Y direction by a predetermined distance, and are connected to the conductor patterns 23c which extend in opposite X directions from the ends of conductor patterns 23b and extend by a fixed distance, and are then connected to the conductor patterns 23d which extend therefrom in the Y direction.

A rectangular space is present in a portion surrounded by the conductor pattern 23c extending in the X direction and two conductor patterns 23d extending in the Y direction, and two conductor patterns 23e formed as dummy patterns having a rectangular ring shape are disposed in the rectangular space so as to be aligned up in the X direction. A disposition interval between the two conductor patterns 23e in the X direction is D3, and the dummy conductor patterns are disposed so that the disposition interval therebetween is set to be the same as a disposition interval between the conductor patterns 23b extending in the Y direction.

The width of the conductor pattern 23d in the X direction extending from the extraction region HU1 of the block BLKn is enlarged in the X direction to form the fringe pattern FP extending in the Y direction to the extraction region HU1 of the block BLKn−1. A predetermined rectangular space is located between the conductor pattern 23e the fringe pattern FP is formed.

First, in FIG. 38A, the opening 32a1 of the resist pattern 32 is located in a predetermined rectangular space portion between the fringe patterns FP and the conductor patterns 23e where two conductor patterns 23d are cut. That is, the opening 32a1 in the resist pattern 32 is located to avoid the portion of the dummy conductor pattern 23e having a rectangular ring shape. Thus, when etching using the opening 32a1 of the resist pattern 32, the portion of the conductor pattern 23d extending between the fringe patterns 23f (FP) primarily in the extraction region HU1 associated with block BLKn and the extraction region associated with block BLKn−1 is removed in the open rectangular space portion, and the dummy conductor pattern 23e remains in place.

In addition, the opening 32a1 of the resist pattern 32 has an opening shape in which the fringe patterns FP of the adjacent pairs are connected by inclined and staggered, in the Y direction, opening patterns having the same width size. Also when etching using the opening 32a1 of the resist pattern 32, the same operational effects as those in the first embodiment may be obtained.

Figure 38B:
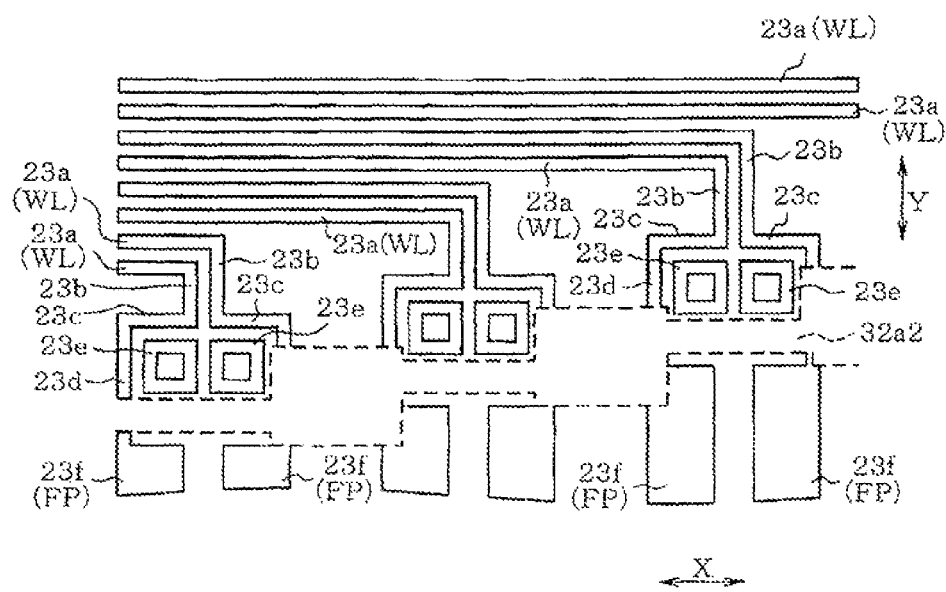

Next, in FIG. 38B, as described above, an opening 32a2 of the resist pattern 32 is located in an opening pattern in which the portions of the conductor patterns 23d of the fringe patterns FP of the adjacent pairs are connected to each other. In addition, the opening 32a1 is set to avoid the portion of the dummy conductor pattern 23e having a rectangular ring shape. As shown in FIG. 38B, an etched (removed) width of the conductor pattern 23b is larger than that of the opening 32a1, and an opening pattern having a rectangular shape is provided between the adjacent patterns. Also in the etching using the opening 32a2 of the resist pattern 32, operational effects similar to those as mentioned above may be obtained.

Figure 38C:
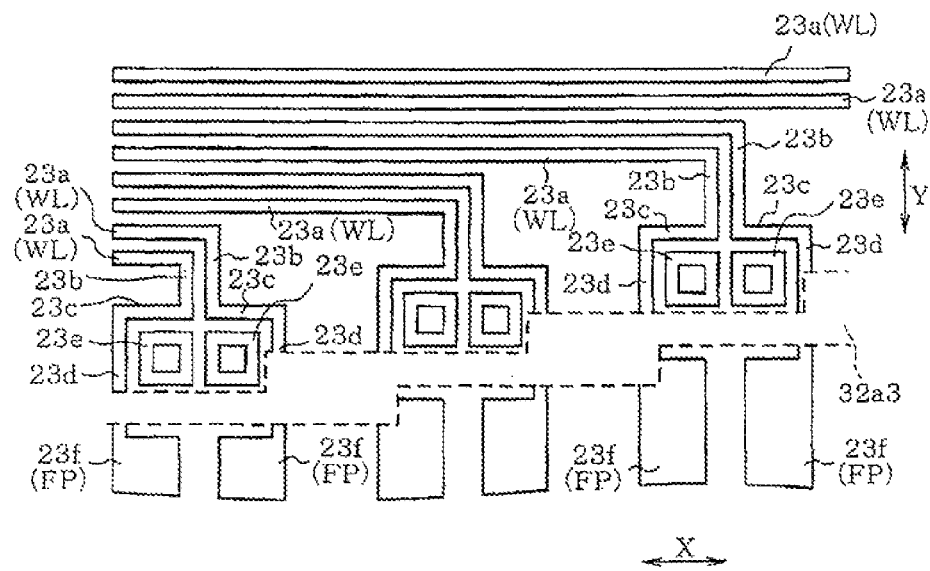

Next, in FIG. 38C, as described above, an opening 32a3 of the resist pattern 32 is provided as an opening pattern in which the portions of the conductor patterns 23d extending from adjacent pairs of fringe patterns FP are connected to each other. In addition, the opening 32a3 is set to avoid the portion of the dummy conductor pattern 23e having a rectangular ring shape. The opening 32a3 is formed as an opening pattern linearly connected in the X direction to the adjacent removed portion, as compared with the opening 32a2 mentioned above. Also in the etching using the opening 32a3 of the resist pattern 32, operational effects similar to those as mentioned above may be obtained.

Figure 38D:
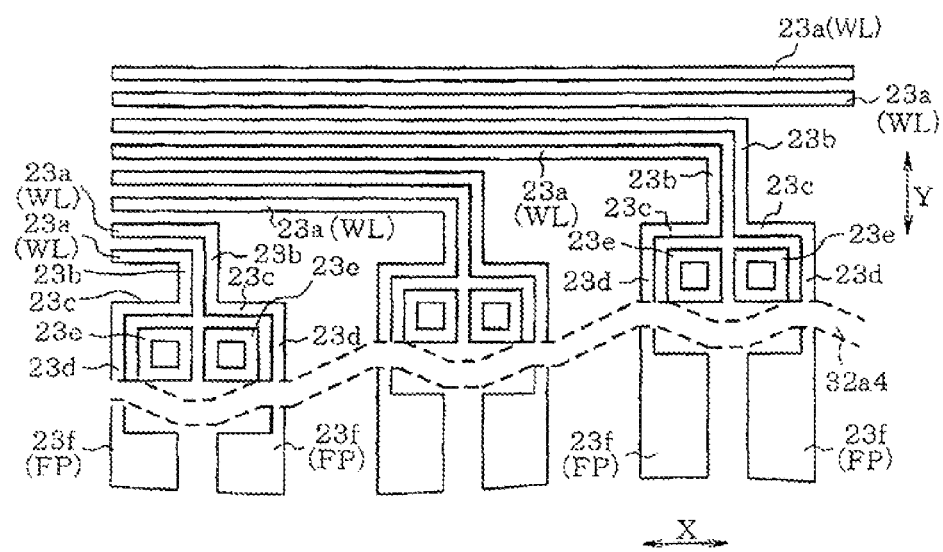

In FIG. 38D, similarly to the opening of FIG. 38A, an opening 32a4 of the resist pattern 32 is provided so as to connect the portions of the conductor patterns 23d and the adjacent pairs of the fringe patterns FP to be opened with the same width size. In addition, the opening 32a4 is positioned to avoid the portion of the dummy conductor pattern 23e having a rectangular ring shape. Meanwhile, as compared with the opening 32a1 mentioned above, the opening 32a4 is formed as an opening having a curved portion so that the conductor pattern 23e having a rectangular ring shape is separated from the adjacent portion at a disposition interval of D3 in a rectangular region surrounded by the conductor pattern 23d. Also in the etching using the opening 32a4 of the resist pattern 32, operational effects similar to those as mentioned above may be obtained.

Figure 38E:
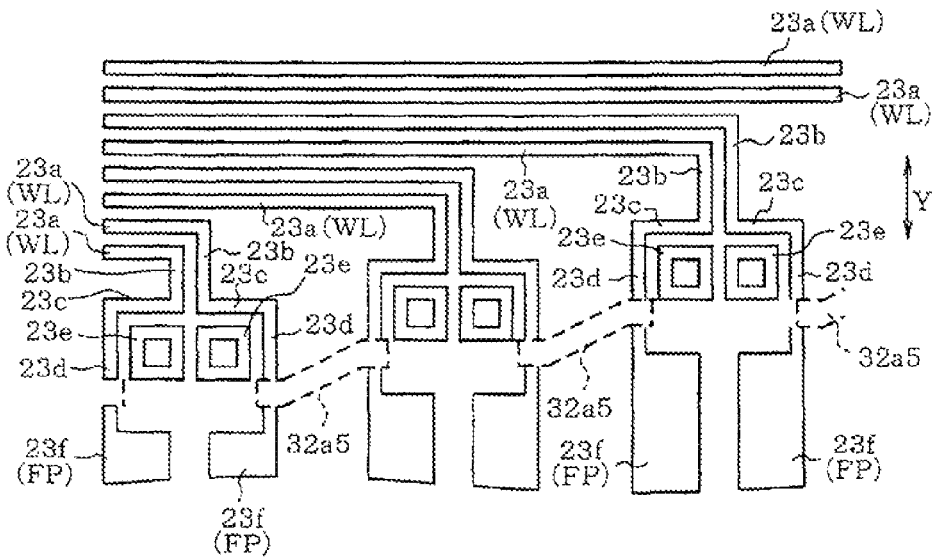

In FIG. 38E, an opening 32a5 of the resist pattern 32 is provided as a divided opening pattern so as to expose one side of the conductor pattern 23d exposed to be removed where the opening is inclined between the adjacent pairs of fringe patterns FP and not to be opened in a rectangular region surrounded by the conductor pattern 23d, with respect to the opening pattern of FIG. 38A. Meanwhile, the opening 32a5 is located to avoid the portion of the conductor pattern 23e having a rectangular ring shape. Also in the etching using the opening 32a5 of the resist pattern 32, operational effects similar to those as mentioned above may be obtained.

Figure 38F:
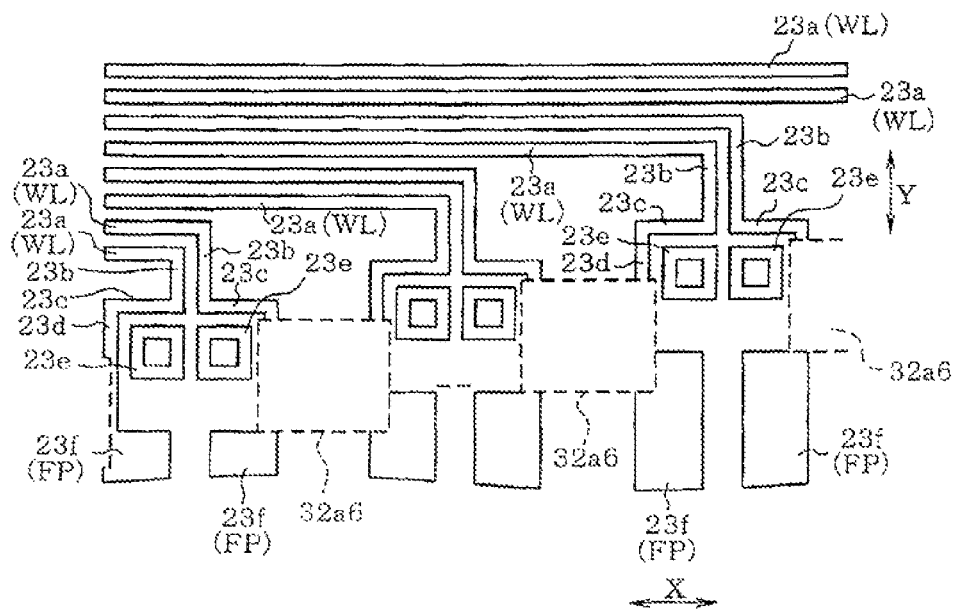

In FIG. 38F, an opening 32a6 of the resist pattern 32 is provided as a divided opening pattern so as to expose one side of the conductor pattern 23d to be opened (removed) within the rectangle shape between the adjacent pairs of fringe patterns FP and not opened in a rectangular region surrounded by the conductor pattern 23d, with respect to the opening pattern in FIG. 38B. Meanwhile, the opening 32a6 is set to avoid the portion of the conductor pattern 23e having a rectangular ring shape. Also in the etching using the opening 32a6 of the resist pattern 32, operational effects similar to those as mentioned above may be obtained.

Figure 38G:
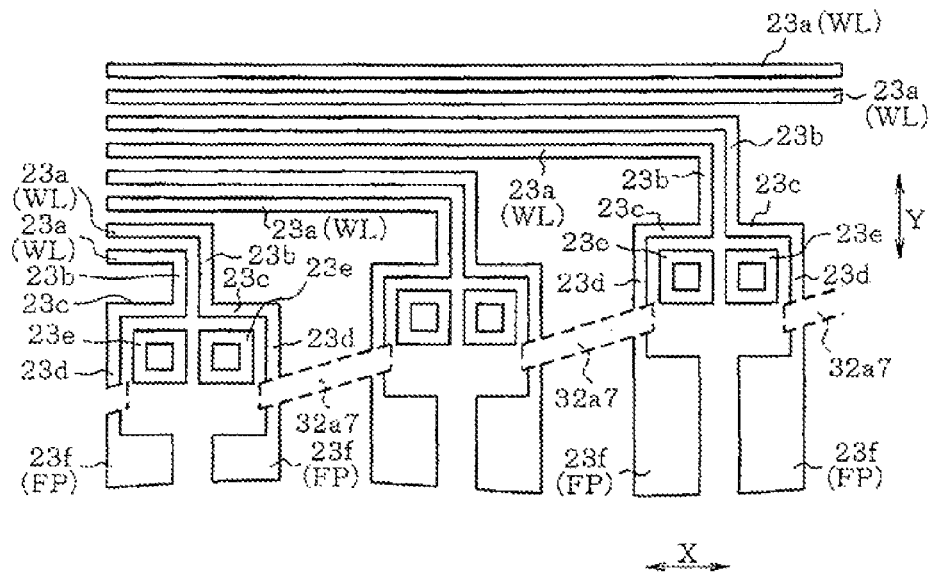

In FIG. 38G, an opening 32a7 of the resist pattern 32 is also inclined in a location crossing the conductor pattern 23d, with respect to the divided opening pattern in FIG. 38E. The degree of the inclination provides an etch removal pattern in which removed portions between the adjacent portions are linearly connected to each other. Also in the etching using the opening 32a7 of the resist pattern 32, operational effects similar to those as mentioned above may be obtained.

Figure 38H:
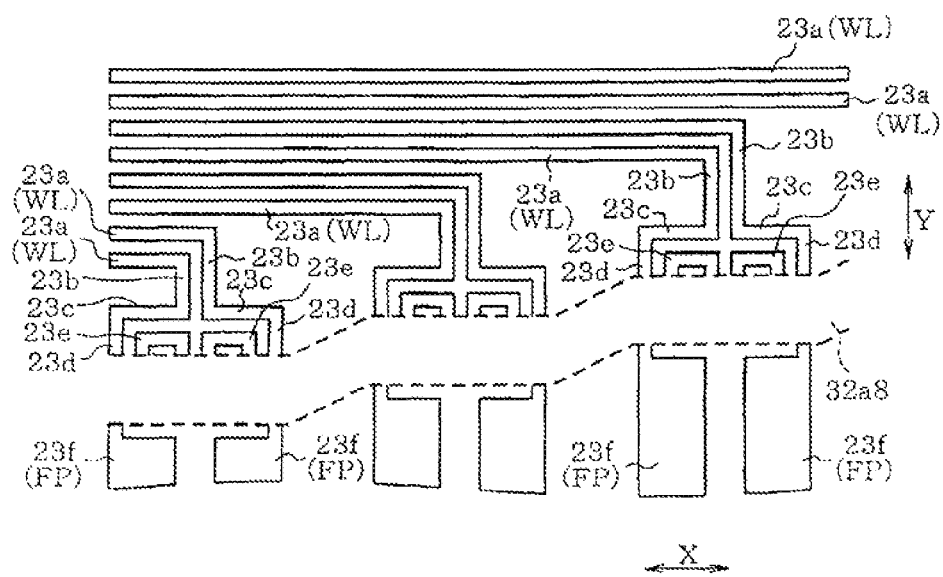

In FIG. 38H, an opening 32a8 of the resist pattern 32 extends a etching position to a portion of the dummy conductor pattern 23e having a rectangular ring shape, as compared to the opening pattern of FIG. 38A. That is, in FIG. 38H, the opening 32a8 is disposed so as to allow removal of the conductor pattern 23e in the middle of a portion of the conductor pattern 23e which extends in the Y direction. Thus, a portion of the conductor pattern 23e facing the conductor pattern 23c and a portion facing the conductor pattern 23d partially remain. Also in the etching using the opening 32a8 of the resist pattern 32, operational effects similar to those as mentioned above may be obtained.

Figure 38I:
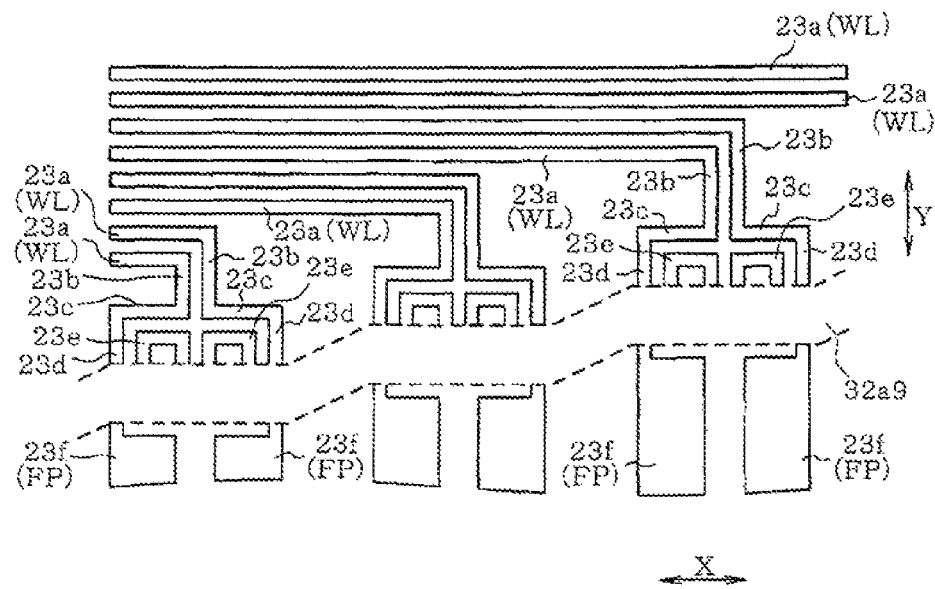

In FIG. 38I, an opening 32a9 of the resist pattern 32 changes a etching position of the conductor pattern 23e having a rectangular ring shape, with respect to the opening pattern in FIG. 38A. That is, in FIG. 38H, the opening 32a9 is disposed so as to allow a side portion of the conductor pattern 23e which is close to the fringe pattern FP to be etched away and to leave other portions. Thus, a portion of the conductor pattern 23e facing the conductor pattern 23c and a portion facing the conductor pattern 23d remain. Also in the etching using the opening 32a9 of the resist pattern 32, operational effects similar to those as mentioned above may be obtained.

In the above-mentioned cases, variations in position are illustrated in a case where the conductor pattern 23e provided as the dummy pattern DP having a rectangular ring shape is removed in the extraction region HU1 on the block BLKn−1 side. FIG. 39J illustrates a comparison between removed positions of the conductor pattern 23e, having a rectangular ring shape, which configures the dummy pattern DP, that is, disposition positions of the opening 32a of a resist. This embodiment illustrates four settings of an opening position.

Here, four side portions of the dummy pattern DP are set as follows. A side portion facing the conductor pattern 23c and extending in the X direction is a first dummy pattern DP1, a side portion facing the conductor pattern 23d and extending in the Y direction is a second dummy pattern DP2, a side portion extending in the X direction on the side close to the fringe pattern FP disposed in parallel with the side portion DP1 is a third dummy pattern DP3, and side portions disposed in parallel with the side portion DP2 and extending in the Y direction at a disposition interval of D3 is a fourth dummy pattern DP4.

Figure 38J:
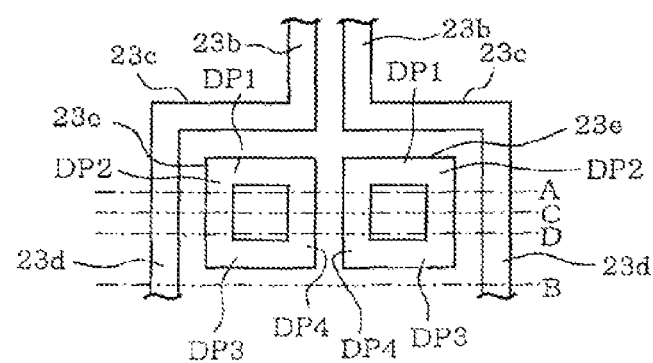

As illustrated in FIG. 38J, in the first embodiment, an end of the opening 32a is positioned at a location shown by a cutting line A so as to leave only the first dummy pattern DP1 of the dummy pattern DP after etching. In FIGS. 38A to 38G illustrating the third embodiment, ends of the openings 32a1 to 32a7 are positioned at a location, shown by a line B, where the dummy pattern DP (DP1 to DP4) remains in place.

In FIG. 38H illustrating the third embodiment, an end of the opening 32a8 is positioned at a location, shown by a line C, where the first dummy pattern DP1, the second dummy pattern DP2, and the side portion DP4 of the dummy pattern DP partially remain. In FIG. 38I illustrating the third embodiment, an end of the opening 32a9 is positioned at a location, shown by a line D, where the first dummy pattern DP1, the second dummy pattern DP2, and the side portion DP4 of the dummy pattern DP remain and the third dummy pattern DP3 is removed.

In the dummy pattern DPb as illustrated in FIG. 37 according to the second embodiment, a conductor pattern 23ha is provided as a fourth dummy pattern in a state where the first dummy patterns DP1 are connected to each other in the X direction. In addition, the conductor pattern 23e as the dummy pattern DP having a rectangular ring shape in the first embodiment may be formed in a state where two conductor patterns 23e lined up in the X direction are coupled to each other. In this case, a state where the conductor patterns 23ea are connected to each other in the cutting portion is set, and the conductor patterns are disposed as the fourth dummy pattern.

Further, the openings 32a8 and 32a9 of the resist pattern 32 respectively illustrated in FIGS. 38H and 38I are configured as opening patterns that linearly cut the conductor pattern 23e and the conductor pattern 23d of the dummy pattern DP in the X direction, but are not limited thereto. The cutting position of the conductor pattern 23d and the cutting position of the conductor pattern 23e do not have a linear shape in the X direction, and the cutting positions may be partially different from each other as illustrated in FIGS. 38B, 38C, 38D, and the like.

Fourth Embodiment

Figure 39:
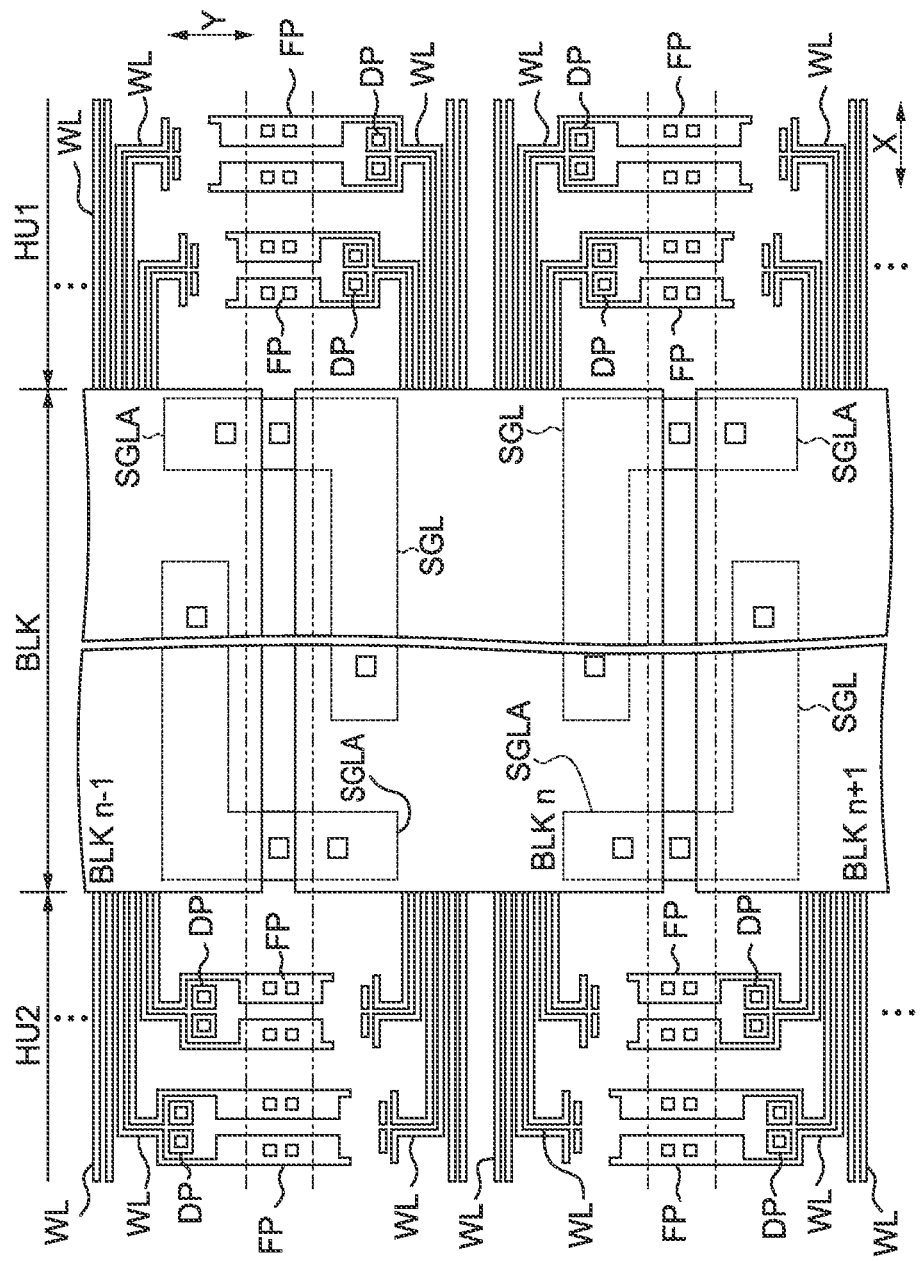
FIG. 39 is an example of a plan view illustrating a layout of a hookup region of word lines in a memory cell region according to a fourth embodiment.

FIG. 39 illustrates a fourth embodiment. In this embodiment, all fringe patterns FP for a block BLK are formed in one of the extraction regions HU1 or HU2.

FIG. 39 illustrates a layout pattern of blocks BLK in a memory cell region MA and wirings of the extraction regions HU1 and HU2. For example, the block BLKn is aligned with blocks BLKn−1 and BLKn+1 which are vertically adjacent thereto in the drawing. In each block BLK (n−1, n, and n+1), memory cell transistors are disposed in a matrix, and the word lines WL thereof are disposed so as to extend to the right and left extraction regions HU1 and HU2. A selection gate line SGL is disposed at upper and lower ends of each block BLK.

In the extraction region HU1, the word lines WL extending from the inside of the block BLKn are bent to extend in the Y direction in pairs and are disposed so as to face the word lines WL of each of the blocks BLKn−1 and BLKn+1 adjacent thereto. For example, in the extraction region HU1, half of the total number of word lines WL disposed within the n-th block BLKn are disposed so as to face half of the number of word lines WL of the block BLKn−1 adjacent thereto, and the other half of the number of word lines WL are disposed so as to face half of the number of word lines WL of the block BLKn+1 adjacent thereto.

Here, in the right extraction region HU1 of the block BLKn in the X direction, an end of the first pair of word lines WL which extend toward the block BLKn−1 is connected to a fringe pattern FP in a facing portion, and an end of the second pair of word lines WL extending toward the block BLKn+1 is also connected to the fringe pattern FP. In the left extraction region HU2 of the block BLKn in the X direction, an of the first pair of word lines WL which extend toward the block BLKn−1 terminates without being connected to the facing FP, and an end of the second pair of word lines WL which extend toward the block BLKn+1 is also terminated without being connected to a fringe pattern FP. The fringe pattern FP is provided with a word line contact WLC.

Both ends of each of the blocks BLKn−1, BLKn, and BLKn+1 in the Y direction are provided with the selection gate line SGL. A bent portion SGLA is formed in an end portion of each selection gate line SGL so as to enter the block BLK adjacent thereto. In a portion in which the bent portion SGLA of the selection gate line SGL is formed, the selection gate line SGL of the corresponding portion is cut. In addition, a contact SGC is disposed in each of the selection gate line SGL and the bending portion SGLA.

Also in the fourth embodiment, the same operational effects as those in the first embodiment may be obtained.

Other Embodiments

In addition to the above-described embodiments, the following modifications may be made.

The removed position of the conductor pattern 23d and the removed position and shape of the conductor pattern 23e may be appropriately set as long as the removed positions of the conductor pattern 23d and the conductor pattern 23e serving as the dummy pattern DP, which are etched through an opening in the resist pattern 32, are set so as to leave the first dummy pattern DP1 or the fourth dummy pattern of a portion facing the conductor pattern 23c and to leave the fringe pattern FP.

The fringe pattern FP may be set to have an appropriate shape in addition to the shapes illustrated in the above-described embodiments. That is, the fringe pattern may be disposed in an appropriate shape between the conductor patterns 23d provided so as to face each other between blocks, or cutting may be performed at an appropriate position other than the fringe pattern FP.

The openings 32a8 and 32a9 illustrated in FIGS. 38H and 38I have shapes conforming with the opening pattern of the opening 32a1 illustrated in FIG. 38A, but may be set to have any of the opening patterns illustrated in FIGS. 38B to 38G without changing the cutting positions of the dummy patterns DPa and DPb.

A case where a NAND type flash memory device is used has been described, but it is possible to use any semiconductor device having a wiring pattern of a line-and-space pattern.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a wiring pattern including:
        a plurality of conductive lines disposed in parallel in a line-and-space pattern extending in a first direction and having a predetermined pitch such that adjacent lines in the line-and-space pattern are spaced from each other at a predetermined distance;
        first bending patterns connected to an end of the line-and-space pattern, each first bending pattern having an adjacent pair of lines in the line-and-space pattern bent in a second direction and extending in the second direction; and
        second bending patterns connected to an end of each first bending pattern, each second bending pattern having the adjacent pairs of lines bent such that each line in the adjacent pair of lines extends away from each other along the first direction; and
    dummy patterns spaced from, and adjacent to, each line in the adjacent pair of lines in each second bending pattern at the predetermined distance in the second direction.

2. The semiconductor device according to claim 1, wherein
    each dummy pattern comprises a first portion having a line shape extending in the first direction in parallel with a one of the lines in the adjacent pair of lines in a corresponding one of the second bending patterns.

3. The semiconductor device according to claim 2, wherein
    each dummy pattern further includes:
    second portions, each second portion being connected to an end of the first portion along the first direction and extending from the end of the first portion in the second direction.

4. The semiconductor device according to claim 3, wherein
    each dummy pattern further includes:
    a third portion having a line shape and extending in the first direction from one second portion connected to the first portion to another second portion connected to the first portion, the second and third portions being spaced from each other in the second direction.

5. The semiconductor device according to claim 1, wherein
    each dummy pattern has a line shape and is divided at an intermediate area thereof, the intermediate area corresponding in position with a spacing between adjacent pair of lines in the second bending patterns.

6. The semiconductor device according to claim 1, wherein the wiring pattern further comprises:
    third bending patterns that are connected to an end of the second bending patterns, each third bending pattern having the adjacent pair of lines bent in the second direction and extending in the second direction.

7. The semiconductor device according to claim 6, wherein
    one of the lines in the adjacent pair of lines in each third bending pattern extends in the second direction to be adjacent to the dummy pattern in the first direction, and the other one of the lines in the adjacent pair of lines extends in the second direction but is not adjacent to the dummy pattern in the first direction.

8. The semiconductor device according to claim 6, wherein
at least one dummy pattern includes a first dummy pattern having a line shape extending along the first direction and a second dummy pattern having portions that are connected to each end of the first dummy pattern and extend in the second direction from the first dummy pattern, and
a first portion of the second dummy pattern extends in the second direction for a first distance and a second portion of the second dummy pattern extends in the second direction for a second distance that is less than the first distance, the first and second portions of the second dummy pattern being spaced from each other in the first direction.

9. The semiconductor device according to claim 6, wherein
the dummy patterns include a first dummy pattern having a line shape and a third dummy pattern, having a line shape, which is separated from the first dummy pattern at a predetermined interval in the second direction, and
the third bending pattern extends in the second direction beyond the position along the second direction at which the third dummy pattern is disposed.

10. The semiconductor device according to claim 1, wherein
the dummy patterns include two annular dummy patterns having a D shape in which a linear pattern and a semicircular pattern are coupled to each other, and
the linear patterns of the two annular dummy patterns are adjacent to each other in the first direction.

11. The semiconductor device according to claim 10, wherein
the linear patterns of the two annular dummy patterns are coupled to each other at least partially.

12. A semiconductor device, comprising:
a first memory block, a second memory block and a third memory block, the second memory block between the first memory block and the third memory block, each of the first, second, and third memory blocks having a first extraction region and a second extraction region associated therewith, each respective memory block being between the first and second extraction regions associated therewith in a first direction;
a plurality of wiring lines extending in the first direction from each of the first, second, and third blocks into the first and second extraction regions, wherein
at least one pair of wiring lines in the plurality of wiring lines extends from the second block into the first extraction region associated with the second block, the pair of wiring lines includes a first portion extending in the first direction from the second block, a first bend portion in which the pair of wiring lines extend in a second direction crossing the first direction toward the first extraction region associated with the first memory block, and a third bend portion in which each wiring line of the pair of wiring lines extends along the first direction away from other wiring line of the pair; and
a dummy pattern adjacent to the third bend portion and including dummy line portions spaced at a predetermined distance in the second direction from each wiring line in the pair of wiring lines, dummy line portions being spaced from each other in the first direction by at least the predetermined distance, the predetermined distance being equal to a spacing distance along the first direction between the pair of wiring lines in the first bend portion.

13. The semiconductor device of claim 12, wherein the pair of wiring lines further include a fourth bend portion, wherein each wiring line of the pair is bent to extend in the second direction toward the first extraction region associated with the first block.

14. The semiconductor device of claim 13, wherein ends of the pair of wiring lines in the fourth bend portion terminate in a fringe pattern.

15. The semiconductor device of claim 14, wherein the dummy line portions are each annularly shaped.

16. The semiconductor device of claim 12, further including a selector gate line in the second memory block.

17. A semiconductor device comprising:
a first, a second and a third memory block, the second memory block interposed between the first and the third memory blocks;
a first extraction region associated with each memory block and located adjacent to a first side thereof in a first orientation direction and second extraction region associated with each memory block and located adjacent to a second side thereof in the first orientation direction;
a plurality of conductive lines formed into wiring patterns wherein the lines are disposed in parallel in a line-and-space pattern having a predetermined pitch and extend in the first orientation direction from each memory block into the first extraction region adjacent thereto in the first orientation direction and also extend in the first orientation direction from each memory block into the second extraction region adjacent thereto, wherein the conductive lines of the wiring patterns extending into the adjacent extraction regions each include;
first bending patterns, in which adjacent pairs of lines in the wiring pattern are bent into, and extend in, a second orientation direction in each of the first and the second extraction regions;
second bending patterns, in which adjacent pairs of lines in the wiring pattern are bent so as to extend away from each other along the first orientation direction in each of the first and the second extraction regions; and
dummy patterns spaced from, and adjacent to, the two second bending patterns at the predetermined distance therefrom, wherein
a fringe pattern, extending from the end of a pair of wiring lines extending in the direction of an adjacent extraction region associated with a different block is provided at the end of a pair of wiring lines in only one of the first and the second extraction regions adjacent to each memory block.

18. The semiconductor device of claim 17, further comprising a third bending pattern extending the wiring lines in the second orientation direction and toward an adjacent extraction region of a different block in the extraction region where the same wiring lines are connected to a fringe pattern.

19. The semiconductor device of claim 18, wherein, in adjacent first extraction regions, a pair of wiring lines in one of the extraction regions extend toward, and are aligned with, a pair of wiring lines in the other of the extraction regions, and,
one of the pairs of wiring lines terminate in a fringe pattern and the other of the pairs of lines terminate in the second bending portion.

20. The semiconductor device of claim 19, wherein an insulating material is disposed between the plurality of wiring patterns of the extraction regions.

* * * * *